United States Patent [19]

Pelc et al.

[11] Patent Number: 4,663,591
[45] Date of Patent: May 5, 1987

[54] METHOD FOR REDUCING IMAGE ARTIFACTS DUE TO PERIODIC SIGNAL VARIATIONS IN NMR IMAGING

[75] Inventors: Norbert J. Pelc, Wauwatosa; Gary H. Glover, Waukesha, both of Wis.

[73] Assignee: General Electric Company, Milwaukee, Wis.

[21] Appl. No.: 766,733

[22] Filed: Aug. 16, 1985

[51] Int. Cl.$^4$ .......................................... G01R 33/20
[52] U.S. Cl. ..................................... 324/309; 128/653
[58] Field of Search ............... 324/300, 307, 309, 308, 324/312, 313, 318, 322; 128/653

[56] References Cited

U.S. PATENT DOCUMENTS

| 4,567,893 | 2/1986 | Charles et al. | 324/309 |
| 4,581,582 | 4/1986 | Redington | 324/309 |
| 4,591,789 | 5/1986 | Glover et al. | 324/307 |
| 4,593,247 | 6/1986 | Glover | 324/309 |
| 4,612,504 | 9/1986 | Pelc | 324/309 |
| 4,614,195 | 9/1986 | Bottomley | 324/309 |

OTHER PUBLICATIONS

C. L. Schultz et al., "The Effect of Motion on Two-Dimensional Fourier Transformation Magnetic Resonance Images," Radiology 1984, pp. 117–121.
D. R. Bailes et al, "Respiratory Ordered Phase Encoding (ROPE): A Method for Reducing Respiratory Motion Artefacts in MR Imaging," Journal of Computer Assisted Tomography, vol. 9, No. 4, pp. 835–838, 1985.
B. Vinocur, "Motion-Reduction Software Brightens Outlook for Body MRI," Diagnostic Imaging, pp. 79, 82 and 84, 8/85.

Primary Examiner—Michael J. Tokar
Attorney, Agent, or Firm—Alexander M. Gerasimow; Douglas E. Stoner

[57] ABSTRACT

A method for reducing image artifacts due to signal variations in the course of examining a subject using nuclear magnetic resonance (NMR) techniques includes the acquisition of scan data for imaging the object. The scan data is composed of a number of views. The acquisition of each view includes the implementation of a pulse sequence to generate an NMR signal and application of a magnetic gradient along at least one dimensional axis of the object. The magnetic field gradient is characterized by a parameter (e.g., amplitude or direction) adjustable from view to view to encode spatial information into the NMR signal. The parameter value is selected just prior to implementation of the pulse sequence for that view and depends on the phase of the signal variation at that point in time. The final view order depends on the measured phase during the scan. In this manner, the view order can be continuously adjusted to obtain optimum artifact reduction. The method is applicable to various NMR imaging techniques, including Fourier transform and multiple angle projection reconstruction.

39 Claims, 20 Drawing Figures

METHOD FOR REDUCING IMAGE ARTIFACTS DUE TO PERIODIC SIGNAL VARIATIONS IN NMR IMAGING

BACKGROUND OF THE INVENTION

This invention relates to nuclear magnetic resonance (NMR) imaging methods. More specifically, this invention relates to method for controlling image artifacts due to substantially periodic NMR signal variations due, for example, to subject motion in the course of an NMR scan.

In the recent past, NMR has been developed as an imaging modality utilizing to obtain images of anatomical features of human patients, for example. Such images depicting nuclear spin distribution (typically, protons associated with water and tissue), spin-lattice relaxation time $T_1$, and/or spin-spin relaxation time $T_2$ are believed to be of medical diagnostic value in determining the state of health of the tissue examined. Imaging data for constructing NMR images can be collected using one of many available techniques, such as multiple angle projection reconstruction and Fourier transform (FT). Typically, such techniques comprise a pulse sequence made up of a plurality of sequentially implemented views. Each view may include one or more NMR experiments, each of which comprises at least an RF excitation pulse and a magnetic field gradient pulse to encode spatial information into the NMR signal. As is well known, the NMR signal may be a free induction decay (FID) or, preferably, a spin-echo signal.

The preferred embodiments of the invention will be described in detail with reference to a variant of the FT technique, which is frequently referred to as "spin warp." It will be recognized, however, that the method of the invention is not limited to FT imaging methods, but may be advantageously practiced in conjunction with other techniques, such as multiple angle projection reconstruction disclosed in U.S. Pat. No. 4,471,306, and another variant of the FT technique disclosed in U.S. Pat. No. 4,070,611. The spin-warp technique is discussed in an article entitled "Spin Warp NMR Imaging and Applications to Human Whole-Body Imaging" by W. A. Edelstein, et al., *Physics in Medicine and Biology*, Vol. 25, pp. 751-756 (1980). Briefly, the spin-warp technique employs a variable amplitude phase encoding magnetic field gradient pulse prior to the acquisition of NMR spin echo signals to phase encode spatial information in the direction of this gradient. In a two-dimensional implementation (2DFT), spatial information is encoded in one direction by applying a phase-encoding gradient along that direction and then observing a spin-echo signal in the presence of a magnetic field gradient in a direction orthogonal to the phase-encoding direction. The gradient present during the spin echo encodes spatial information in the orthogonal direction. In a typical 2DFT pulse sequence, the magnitude of the phase-encoding gradient pulse is incremented monotonically in the temporal sequence of views.

Although it has been known that some NMR imaging pulse sequences produce artifacts due to object motion, early in the development of NMR imaging it was believed that among the advantages of the FT imaging method was its property of not producing motion artifacts. However, it is now well recognized that this is not so. Object motion during the acquisition of an NMR image produces both blurring and "ghosts" in the phase-encoded direction. Ghosts are particularly apparent when the motion is periodic, or nearly so. For most physiological motion, including cardiac and respiratory motion, each NMR spin echo or FID can be considered a snapshot view of the object. Blurring and ghosts are due to the inconsistent appearance of the object from view to view.

Both deleterious effects of periodic motion, blurring and ghosts, can be reduced if the data acquisition is synchronized with the periodic motion. This method is known as gated scanning. Gating can also be used to study the mechanical dynamics of the motion itself, if that is of interest. The drawback of gating is that, depending on the period of the motion the fraction of the period during which acceptable data can be acquired, and the shortest acceptable pulse sequence repetition time, gating can significantly lengthen the data acquisition time.

While gating is required when the blurring due to the motion is unacceptable and when the motion itself is of interest (e.g., cardiac motion or flow), there are other applications where the loss of detail of the moving structures can be tolerated, but the disturbing effects of the ghosts which can extend far from the moving object cannot be accepted. In such applications, a method that can reduce or eliminate ghosts without the restrictions of gating is needed.

Ghost artifacts similar in character to those due to motion of the object portion being imaged can be caused by other substantially periodic variation in the NMR signals. Variations in the amplitude or phase of the received signals may be caused by changes in the RF coil characteristics due to motion of objects not under examination. Signal variations may also be caused by noise sources, e.g., line frequency noise whose phase varies from view to view in a substantially periodic manner. Reduction of these artifacts is also of interest and is within the scope of the present invention. Collectively, signal variations due to motion of the object being imaged as well as due to the indirect causes described above will be referred to hereinafter as signal variations.

One proposed method for eliminating ghost artifacts is disclosed and claimed in U.S. patent application Ser. No. 673,690, filed Nov. 21, 1984, now U.S. Pat. No. 4,567,893 and which is assigned to the same assignee as the present invention. In this case, it is recognized that the distance between the ghosts and the object imaged is maximized when the pulse sequence repetition time is an odd multiple one-fourth of the motion period (if two phase-alternated RF excitation pulses per view are used, as disclosed and claimed in commonly assigned U.S. Pat. No. 4,443,760, issued April 17, 1984). In the above-identified patent application, it is recognized that this ratio can be used to alleviate ghosts due to respiratory motion. While this method, indeed, improves image quality, it does impose a constraint on the pulse sequence repetition time used and usually results in a longer scan time.

With the projection reconstruction imaging techniques, substantially periodic motion again causes local distortion and blurring, as well as artifacts that extend well away from the moving structure. In this technique, the artifacts are manifested as streaks rather than ghosts. Once again, a method of reducing the distant effects can be of significant benefit.

Another method for reducing the undesirable effects due to periodic signal variations is disclosed and claimed in commonly assigned/concurrently filed U.S. patent application Ser. No. 766,842. In this method, a view increment time is selected, an assumption is made about the signal variation period (e.g., due, for example, to patient respiration) and a view order is generated prior to the beginning of the scan. View order selection involves establishing the order in which either the variable amplitude phase-encoding gradient pulses (in the spin-warp method) or the direction of the imaging gradient pulses (in multiple angle projection reconstruction method) are implemented. For a given signal variation period, and known view increment time, a view order is chosen so as to make the motion as a function of the phase-encoding amplitude or gradient direction be at any frequency. In one embodiment, the view order is selected such that the variation period appears to be equal to the scan time (low frequency) so that the ghost artifacts are brought as close to the moving object as possible. In another embodiment (high frequency), the view order is chosen to make the variation period appear to be equal to twice the pulse repetition time so as to attempt to push the ghost artifacts as far from the object as possible. Although this method is effective in reducing artifacts, and is in some respects ideal if the variation is rather regular and at a known frequency, the method is not very robust if the assumption made about the motion temporal period does not hold (e.g., because the patient's breathing pattern changes or is irregular). If this occurs, the method loses some of its effectiveness because the focussing of the ghosts, either as close to the object or as far from the object as possible, becomes blurred.

Accordingly, it is a principal object of the present invention to provide a method for achieving ghost artifact reduction or elimination which avoids the disadvantages of the aforedescribed methods.

It is another object of the present invention to provide a method for achieving ghost artifact reduction or elimination when the signal variations are not substantially periodic and/or the period of variation is not known a-priori.

It is yet another object of the present invention to provide a method for achieving ghost artifact reduction or elimination in which the view order is selected in real time based on measurements made during the scan.

It is still another object of the present invention to provide a method which is effective in achieving ghost artifact reduction or elimination while allowing complete freedom on the choice of pulse sequence repetition time.

SUMMARY OF THE INVENTION

In accordance with the invention, there is provided a method for reducing artifacts in a desired image due to substantially periodic signal variations while a portion of an object is being examined using nuclear magnetic resonance techniques. These techniques include measurement of imaging data about the object portion through the implementation of a plurality of views, each made up of at least one pulse sequence which includes irradiation of the object portion by an RF excitation pulse at the Larmor frequency to produce an NMR signal, application of a pulsed magnetic field gradient along at least one dimensional axis of the object, and acquisition of imaging data. The magnetic field gradient has a parameter value adjustable to have a different value in each view so as to encode spatial information into the NMR signal. The method includes: Selecting a predetermined relationship between the signal variations and the parameter value of the magnetic field gradient, wherein selection of the relationship defines a correspondence between a desired parameter value to be implemented in a given pulse sequence and the phase of the signal variations; measuring the phase of the signal variations in the course of implementing the plurality of views; and selecting a non-monotonic temporal order of application of the magnetic field gradient so as to approximate the predetermined relationship, wherein the order is based on said phase measurements, thereby to reduce artifacts in the desired image.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

FIG. 14 shows a plot of brightness versus phase-encoding amplitude for the high frequency sort embodiment of FIG. 14;

DETAILED DESCRIPTION OF THE INVENTION

Figure 1:
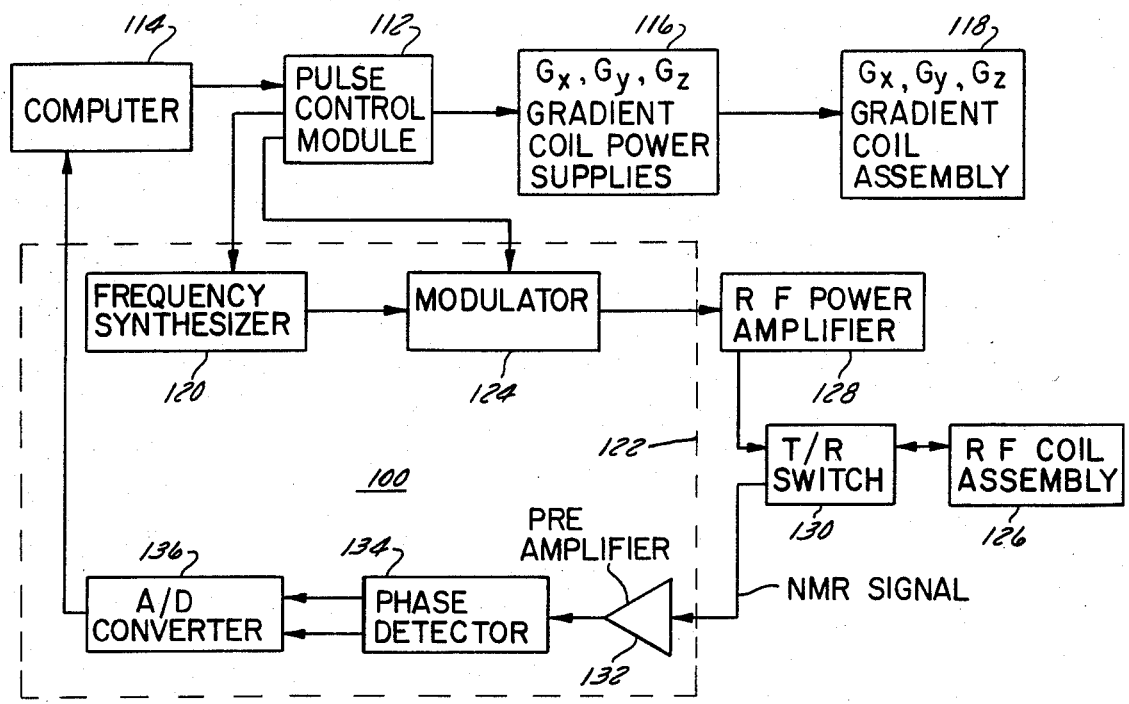
FIG. 1 depicts in block schematic form an exemplary NMR system useful for practicing the invention.

FIG. 1 is a simplified block diagram of an NMR imaging system with respect to which the preferred embodiment of the invention will be disclosed. It will be recognized, however, that the invention as claimed may be advantageously practiced with any suitable MR apparatus. The system, generally designated 100, includes a pulse control module 112 which provides properly timed pulse waveform signals, under the control of a host computer 114, to magnetic field gradient power supplies collectively designated 116 which energize gradient coils forming part of a gradient coil assembly generally indicated by a block 118. The assembly contains coils which, when energized by the power supplies, produce the $G_x$, $G_y$, and $G_z$ magnetic field gradients directed in the x, y, and z directions, respectively, of the Cartesian coordinate system. The use of the $G_x$, $G_y$ and $G_z$ gradients in NMR imaging applications will be described hereinafter with reference to FIG. 2.

Continuing with reference to FIG. 1, the pulse control module provides activating pulses to an RF synthesizer 120 which is part of an RF transceiver system, portions of which are enclosed by dash-line block 122. The pulse control module also supplies modulating signals to a modulator 124 which modulates the output of the RF frequency synthesizer. The modulator RF signals are applied to an RF coil assembly 126 through an RF power amplifier 128 and a transmit/receive switch 130. The RF signals are used to excite nuclear spins in a sample object (not shown) undergoing examination.

The NMR signals from the excited nuclear spins are picked up by the RF coil assembly and applied through the transmit/receive switch to an RF preamplifier 132 and then to a quadrature phase detector 134. The detected signals are digitized by A/D converter 136 and applied to computer 114 for processing in a well-known manner to, for example, reconstruct NMR images of the sample.

As used herein, a view will be defined as being a set of NMR measurements made with the same position-encoding gradients. Thus, a view may contain measurements obtained with the sign of the 90° RF pulses alternated, or repeat measurements to improve the signal-to-noise ratio. During a scan, a discrete set of the magnetic field gradient values are used to provide spatial information. The component signals for one view need not be acquired sequentially in time although this is usually the case.

Figure 2:
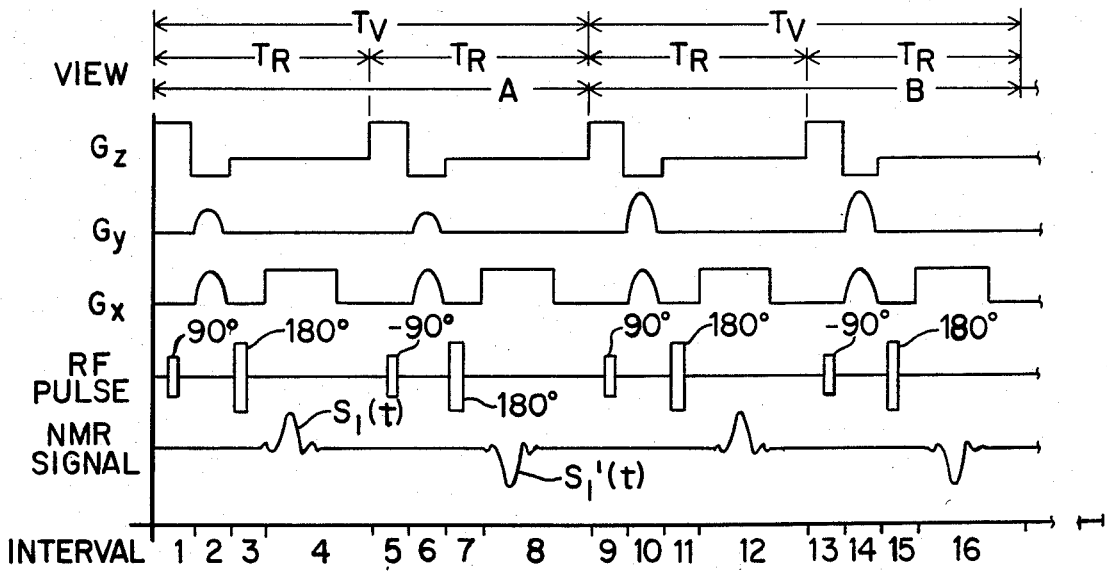
FIG. 2 depicts an exemplary FT imaging pulse sequence of the type known as two-dimensional spin warp.

Initial reference is made to FIG. 2 which depicts two views of what can now be referred to as a conventional imaging pulse sequence of the type known as two-dimensional Fourier transform (2DFT), which is frequently also referred to as two-dimensional "spin warp." This pulse sequence is useful in obtaining, in a well-known manner, imaging data to reconstruct images of a sample being investigated. The pulse sequence utilizes phase-alternated RF excitation pulses which, as disclosed and claimed in the aforeidentified U.S. Pat. No. 4,443,760 and as will be briefly described hereinbelow, produce phase-alternated NMR signals used to cancel certain baseline errors.

The manner in which this is accomplished in the conventional pulse sequence will now be described with reference to FIG. 2 which depicts two phase-encoding views A and B of a pulse sequence which in practice can contain, for example, 128, 256, or 512 phase encoding views. Each view in FIG. 2 is comprised of two NMR experiments. Referring now to View A in FIG. 2, there is shown in interval 1 (indicated along the horizontal axis) a selective 90° RF excitation pulse applied in the presence of a positive $G_z$ magnetic field gradient pulse. Pulse control module 112, FIG. 1, provides the needed control signals to the frequency synthesizer and modulator so that the resulting excitation pulse is of the correct phase and frequency to excite nuclear spins only in a predetermined region of the sample. Typically, the excitation pulse can be amplitude modulated by a (sin x)/x function. The frequency of the synthesizer is dependent on the strength of the applied magnetic field and the NMR species being imaged in accordance with the well-known Larmor equation. The pulse control module also applies activating signals to the gradient power supplies to generate, in this case, the $G_z$ gradient pulse.

Continuing with reference to FIG. 2, $G_x$, $G_y$ and $G_z$ gradient pulses are applied simultaneously in interval 2. The $G_z$ gradient in interval 2 is a rephasing pulse typically selected such that the time integral of the gradient waveform over interval 2 is approximately equal to $-\frac{1}{2}$ of the time integral of the gradient waveform over interval 1. The function of the negative $G_z$ pulse is to rephase the nuclear spins excited in interval 1. The $G_y$ gradient pulse is a phase-encoding pulse selected to have a different amplitude in each of Views A, B, . . . , etc., to encode spatial information in the direction of the gradient. The number of different $G_y$ gradient amplitudes is typically selected to equal at least the number of pixel resolution elements the reconstructed image will have in the phase-encoding (Y) direction. Typically, 128, 256 or 512 different gradient amplitudes are selected. In the spin warp embodiment of FT imaging, the duration of the $G_y$ gradient pulse is held constant while the amplitude is sequenced through a range of values. It will be recognized, however, that the degree of phase encoding is in reality a function of the time integral of the gradient pulse waveform which in this case is proportional to the amplitude of the gradient pulse.

The $G_x$ gradient pulse in interval 2 is a dephasing pulse needed to dephase the excited nuclear spins by a predetermined amount to delay the time of occurrence of a spin-echo signal $S_1(t)$ in interval 4. The spin echo is produced typically by the application of a 180° RF pulse in interval 3. As is known, the 180° RF pulse is a time-reversal pulse which reverses the direction of spin dephasing so as to produce the spin-echo signal. The spin-echo signal is sampled in interval 4 in the presence of a linear $G_x$ gradient pulse to encode spatial information in the direction of this gradient.

In the pulse sequence of FIG. 2, baseline error components are eliminated by using an additional NMR experiment in View A. This second experiment is substantially identical to the first with the exception that the RF excitation pulse in interval 5 of View A is selected to be 180° out of phase (as suggested by the minus sign) relative to the excitation pulse in interval 1 of View A, so that the resulting spin-echo signal $S_1'(t)$ in interval 8 is 180° out of phase with the spin-echo signal $S_1(t)$ in interval 4. If the signal $S_1(t)$ is subtracted from $S_1(t)$, only those components of the signals with reversed sign in the signal $S_1'(t)$ are retained. The baseline error components cancel.

The process described above with reference to View A is repeated for View B and so on for all amplitudes of the phase-encoding $G_y$ gradient. The two experiments with excitation pulses 180° out of phase in each view will be referred to as a "chopper" pair. The use of the pulse sequence depicted in FIG. 2 to eliminate baseline error components necessarily means that the minimum number of excitations or NMR experiments per view is two which results in an increase in the signal-to-noise ratio by a factor of $\sqrt{2}$ over what it would be if a single excitation were used.

It should be noted that the invention can also be practiced with three-dimensional Fourier transform techniques. U.S. Pat. No. 4,431,968, assigned to the same assignee as the present invention and which is incorporated herein by reference, discloses and claims three-dimensional Fourier transform techniques. Briefly, in three-dimensional Fourier transform NMR imaging techniques, phase-encoding gradients are applied in more than one dimension. For these techniques, additional $G_z$ phase-encoding gradient pulses are added to interval 2 of FIG. 2, for example, and the excitation/sampling process described hereinabove is repeated in subsequent views of the pulse sequence until the $G_y$ and $G_z$ gradients are all sequenced through their complete range of amplitudes before the spatial image is complete. Accordingly, although specific reference is made hereinbelow to methods for sequencing $G_y$ in two-dimensional Fourier transform techniques, it is understood that the same sequencing methods are equivalently applicable to other gradient components when applied for phase-encoding purposes in three-dimensional Fourier transform techniques.

Figure 3:
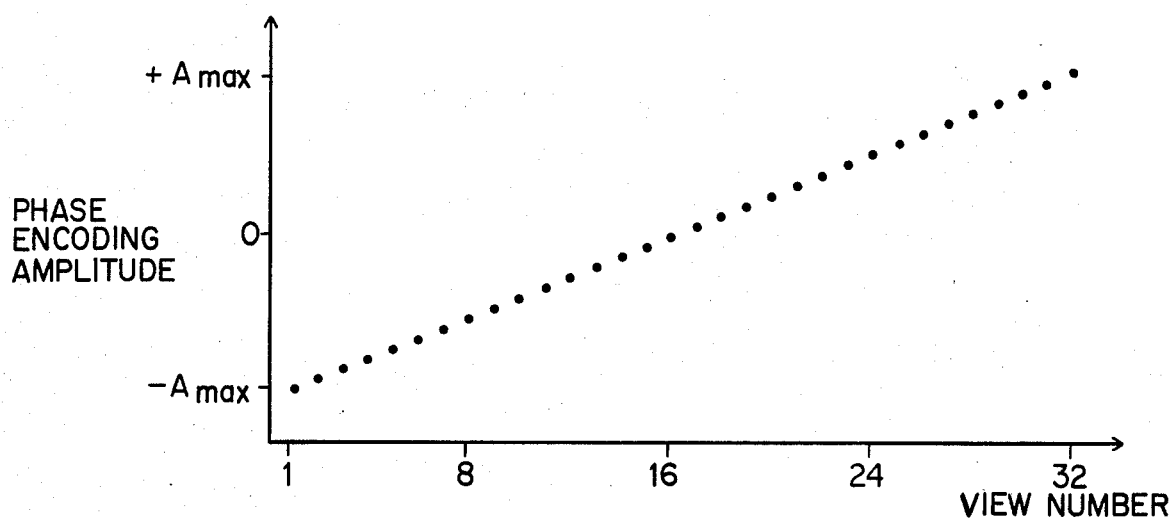
FIG. 3 illustrates a conventional sequence for incrementing the amplitude of the phase-encoding gradient in a pulse sequence such as the one shown in FIG. 2.

FIG. 3 depicts a conventional sequence for incrementing the amplitude (indicated along the vertical axis) of the $G_y$ phase-encoding gradient in adjacent views (indicated along the horizontal axis) of a two-dimensional spin-warp pulse sequence, such as the exemplary sequence described with reference to FIG. 2. In FIG. 3, each dot represents one $G_y$ gradient amplitude. For simplicity, a 32-view scan is assumed in FIG. 3. Typically, the scan would have, for example, 128 views and in view 1, the $G_y$ gradient is selected to have a predetermined negative amplitude ($-A_{max}$). Subsequently, in views 2–63, the amplitude is increased monotonically through a value of near 0 at view 64 and thence further increased monotonically to a positive amplitude ($+A_{max}$) at view 128.

As alluded to hereinabove, it has been found that quasi-periodic motion of the subject due, for example, to respiration, when using the phase-encoding amplitude sequence of FIG. 3, leads to structured artifacts (manifested in reconstructed images as ghost images along the phase-encoding direction) and loss of resolution. The primary source of these artifacts has been determined to be motion-induced phase and amplitude errors in the phase-encoding direction when using FT imaging techniques. Specifically, to the extent that the motion is a periodic function of phase-encoding, the artifact will appear as discrete ghost or ghosts, replicating some of the features of the desired image.

Prior to describing how blurring and ghost artifacts due to object motion are reduced or eliminated in accordance with the invention, it will be instructive to consider the following discussion of the causes of these artifacts.

A simple way to understand motion-induced artifacts in FT imaging is not by dealing with motion directly, but by considering a small volume fixed in space whose NMR signal is a function of time. This small volume will be referred to herein as a pixel even though it is actually a region in space rather than a portion of the reconstructed image, and its NMR signal as brightness. The temporal variation in brightness could be due to, for example, material moving into and out of the small volume fixed in space. Note that by treating amplitude variations, not only can rigid motion be understood, but any other type as well. As was discussed hereinabove, variations in the NMR signal produced by effects other than motion can also generate ghost artifacts. These are included within the scope of the present discussion. In-plane motion causes brightness to increase in one pixel while it decreases in another. Regardless of motion direction, due to the linearity of the imaging process, each pixel can be treated independently. Further, since it can be assumed that each view is an instant snapshot, only the column in the image in the phase-encoding direction containing the pixel of interest need be considered.

Thus, assume the object is only a function of one dimension (the phase-encoded direction, e.g., y), that only a single point at $y_o$ has any intensity, and for now, assume it has constant brightness $B_o$. Then, the object is $$o(y) = B_o \delta(y - y_o) \tag{1}$$

where $\delta$ is a Dirac delta function.

The measurements made in an FT imaging method form the Fourier transform of object o:

$$O(k_y) = \mathcal{F}[o(y)] = B_o e^{-2\pi i k_y y_0}, \tag{2}$$

where $k_y$ is a spatial frequency in the y direction, which, for 2DFT imaging, is proportional to the area under the phase-encoding gradient pulse. If variations in the object's brightness are now allowed so that when the measurement at $k_y$ made the pixel brightness is $B_o + B(k_y)$, where $B_o$ is the average value, then the measured signal is:

$$H(k_y) = [B_o + B(k_y)]e^{-2\pi i k_y y_0} \tag{3}$$

$$= B_o e^{-2\pi i k_y y_0} + B(k_y) e^{-2\pi i k_y y_0} \tag{4}$$

Note that the error term, the second term on the right-hand side, is the Fourier transform of the single point modulated by brightness variation.

The resulting image is the inverse Fourier transform of H:

$$h(y) = \mathcal{F}^{-1}\{B_o e^{-2\pi i k_y y_0}\} + \mathcal{F}^{-1}\{B(k_y)e^{-2\pi i k_y y_0}\} \tag{5}$$

The first term on the right-hand side is the desired image of the average object brightness. Using the convolution theorem on the second term results in:

$$h(y) = B_0\delta(y-y_o) + \delta(y-y_o) * g(y), \quad (6)$$

where g(y) is the ghost kernel which is equal to the inverse Fourier transform of the temporal variation. The word "temporal" is used here to define how the brightness amplitude varies with phase-encoding amplitude $k_y$ rather than time. For now, it may be assumed that phase-encoding amplitude is proportional to time, as it is in a conventional imaging sequence. Thus, $$g(y) = \mathcal{F}^{-1}[B(k_y)]. \quad (7)$$

The first term on the right-hand side of Equation (6) describes motion blurring. As the object moves, each point in the image through which the object passes will receive a contribution proportional to the amount of time the object spent at that point throughout the imaging sequence (throughout the measurements, to be precise). The second term in Equation (6) shows that whatever temporal variations there are at a point will produce ghosts. The ghosts emanate in the phase-encoding direction from the source. The details of the ghosts depend on the frequency content of the temporal variations.

Figure 4:
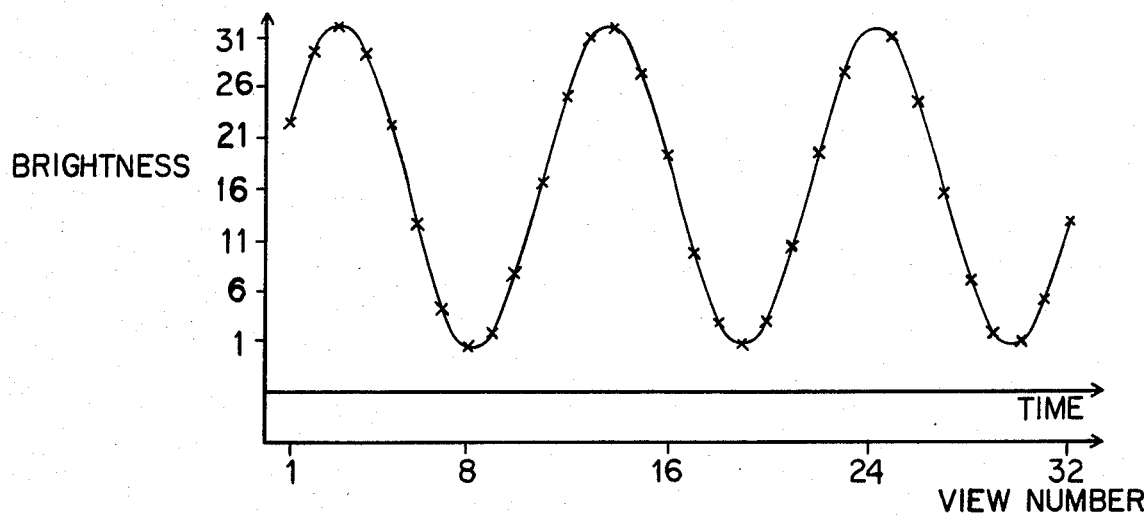
FIG. 4 depicts object brightness versus time for an object whose amplitude is varying sinusoidally as a function of time.

Suppose, firstly, that the function $B(k_y)$ is a sinusoid. FIG. 4 shows a plot of the object brightness (vertical axis) versus time. Also shown in FIG. 4 as a set of points designated by "X" marks is the object brightness at each of the discrete times at which a view measurement is taken. In practice, this function may have many cycles during one scan; e.g., 10–20 or more, depending on, for example, the respiration rate of the subject being imaged. For simplicity, FIG. 4 depicts only three cycles. Function $B(k_y)$ may be expressed as:

$$B(k_y) = \Delta B \sin(2\pi f^* k_y + \phi), \quad (8)$$

where f* is the frequency in brightness cycles per spatial frequency $(k_y)$ increment. To make this more intuitive, the frequency f* may be converted to brightness cycles per scan. Assume there are $N_v$ views, that the field of view is FOV so that the frequency increment is 1/FOV. The frequency in cycles per scan then is:

$$f = f^*(1/FOV)N_v. \quad (9)$$

Using Equation (9) for the sine wave of Equation (8) and substituting into Equation (7), the ghost kernel is:

$$g(y) = \frac{\Delta B}{2}\{[\sin(\phi) + i\cos(\phi)]\delta(y - fFOV/N_v)\} + \quad (10)$$

$$\frac{\Delta B}{2}\{[\sin(\phi) - i\cos(\phi)]\delta(y + fFOV/N_v)\}$$

Thus, the ghost kernel for simple sinusoidal brightness variation causes there to be two ghosts emanating from the source pixel. The first term produces a ghost above the source pixel while the second produces a ghost below the source pixel. It will be recognized that in an actual image, many points in the image may be producing ghosts. In practice, strong ghost artifacts are observed emanating from high contrast boundaries.

Figure 5:
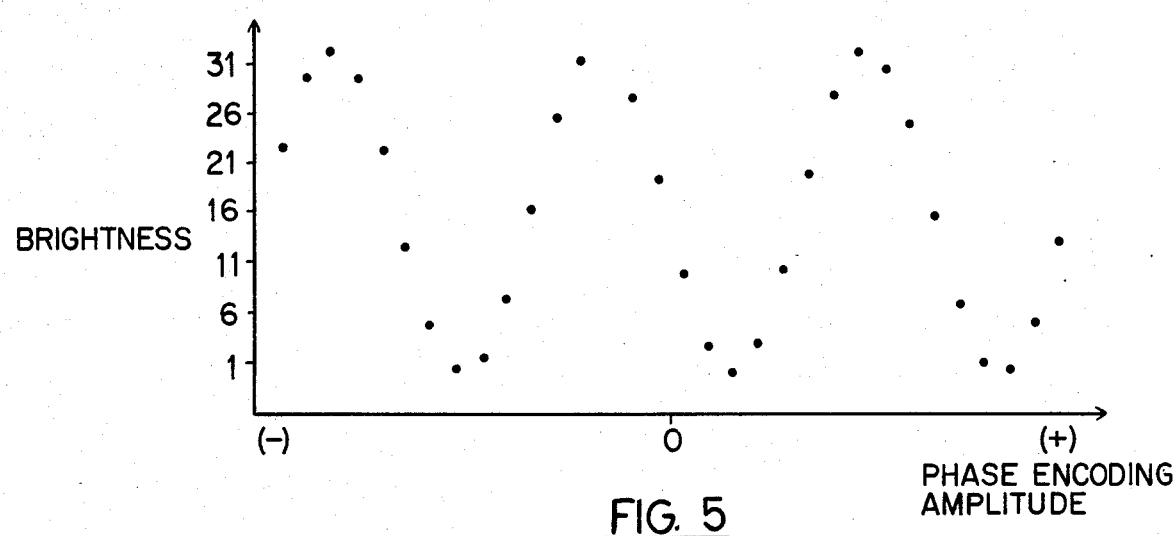
FIG. 5 depicts object brightness versus phase-encoding amplitude for a scan in which the amplitude of the phase-encoding gradient is implemented monotonically in the manner illustrated in FIG. 3.

The distance between the object pixel and the ghosts is determined by the frequency of the relationship between brightness and phase-encoding amplitude (e.g., FIG. 5). As the frequency of the motion increases, the ghosts move farther away from the source pixel. Since there are a finite number of views, the observed frequency cannot be greater than $N_v/2$ cycles per scan. If the actual frequency is greater, it will simply alias to a lower frequency. Thus, from Equation 10, it may be seen that the farthest the ghost can be from the source pixel is one half of the field of view. At frequencies just higher than that, the frequency will be aliased to just below $N_v/2$ and as the frequency increases further, the ghosts will come closer to the source pixel. At a frequency of $N_v$ cycles per scan the ghosts will be superimposed on the source pixel. This condition is known as gating. Another constraint is that the ghosts cannot extend beyond the scanned field of view. If a ghost tries to do that, it will alias and reappear at the opposite extreme of the scanned field. For example, if $y_o + f\,FOV/N_v$ exceeds (FOV/2) the upper ghost given by the first term in Equation (10) will wrap around and appear at the bottom of the image. Then, as f increases, that particular ghost will move toward the image center. Note that the lower ghost at $(y_o - f\,FOV/N_v)$ may still be at its expected location, so in this case both ghosts could be below the source pixel.

Note in Equation (10) that the two ghosts have a complex amplitude. The phase of each depends on the phase of the sinusoid. In general, the phase of the one ghost is different from the phase of the other and also from the phase of the desired image.

If the brightness variation is more complicated than a single sinusoid, the ghost kernel Equation (7) will also be more complicated and as a result more than 2 ghosts will emanate from the source pixel. In general, for substantially periodic variations, a series of discrete ghosts will be produced, one for each harmonic of the basic variation frequency.

For the simple 32-view example described hereinbefore, if the typical monotonic phase-encoding order (FIG. 3) is applied, the relationship between source brightness and phase-encoding amplitude is as shown in FIG. 5. Each point in FIG. 5 is generated by finding, for each view, the brightness value in FIG. 4 and the phase encoding in FIG. 3. The location of the ghosts is determined by the frequency content of this relationship between brightness and phase-encoding amplitude.

One possible way to reduce the disturbing effects of ghosts, disclosed and claimed in afore-identified U.S. Pat. No. 4,567,893 is to try to move the ghosts as far from the object as possible. According to Equation (10), that happens when the major component variation is at $N_v/2$ cycles per scan. If an object is moving in a nearly periodic manner at a frequency of $N_v/2$ cycles per scan, most of the variable energy in the pixels whose brightness is time varying will be at that frequency. If, in addition, the phase-encoding amplitudes are incremented monotonically, as is usually done, then the temporal brightness function translates simply into brightness as a function of phase encoding. The net result is that the ghosts will be as far from the object as possible, FOV/2. In a conventional single plane imaging sequence using one pair of phase-alternated RF excitation pulses (chopper pair), this relationship is accomplished when repetition time $T_R$ (FIG. 2) is equal to the breathing period divided by 4. The extra factor of 2 is due to the use of two phase-alternated RF excitation experiments per phase-encoding amplitude. Thus, one method of controlling the effects of periodic motion is to choose a repetition time $T_R$ once the motion period is known.

At this point, it is helpful to describe in some detail the concepts disclosed in the aforementioned commonly assigned, concurrently filed U.S. patent application No. 766,842. Therein, the general method of choosing the values of the gradient parameter (e.g., phase-encoding amplitude) in a manner such that the distrubing effects of motion (or other signal variation producing phenomena) are diminished is disclosed and claimed. Two "modes" are described. In one, the "low frequency sort mode," a view order that results in the reduction of the distance of the ghosts from the source pixel is used. In the other, the "high frequency sort mode," the distance of the ghosts from the source pixel is maximized. This latter mode is best implemented if the scanned field of view (FOV) in the phase-encoded direction is substantially larger than the size of the object (e.g., twice as large) so that the ghosts do not overlay structures of interest. Also described in the aforementioned application are methods by which the view order can be selected. It is this view order selection method over which the present invention is an improvement. Before proceeding with the description of the view order selection methods, it is helpful to further describe the concepts by which the artifacts are controlled.

A parameter representative of the position of the object is needed. One possible parameter is the relative phase of the object within its motion cycle. As will be described hereinbelow, a parameter more directly related to object position can also be used. These position defining parameters will be referred to as "motion phase," although they may not be a phase in a rigorous sense. Further, although motion is referred to here, the invention is applicable to other types of signal variations.

Basically, the goal is to select the order in which the various gradient parameter values are implemented so that, after the data are reordered in monotonic order of gradient parameter, the apparent frequency of the motion is changed.

Figure 6:
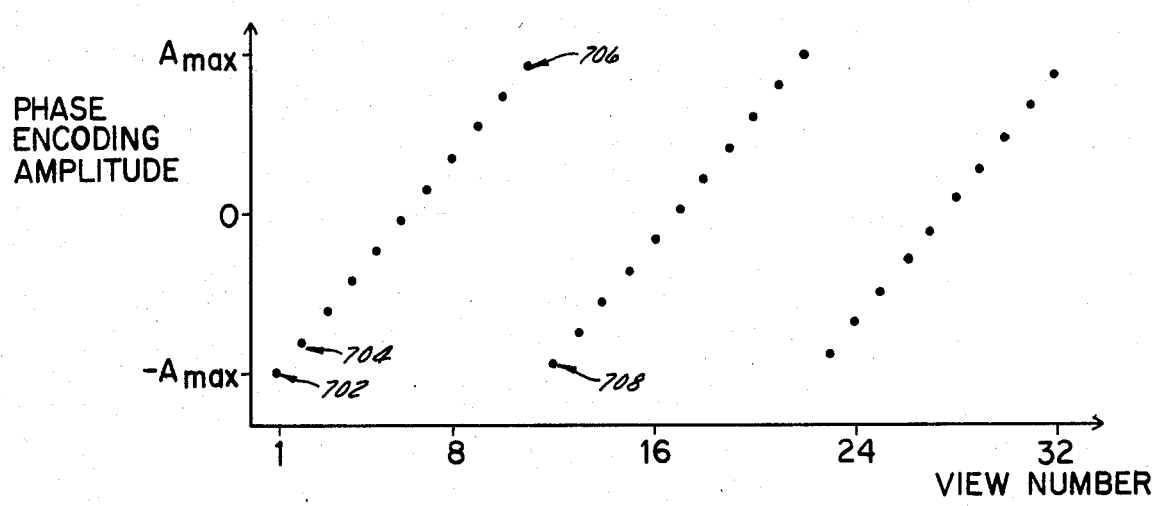
FIG. 6 depicts phase-encoding amplitude for each view in accordance with the low frequency mode embodiment a prior method.
Figure 8:
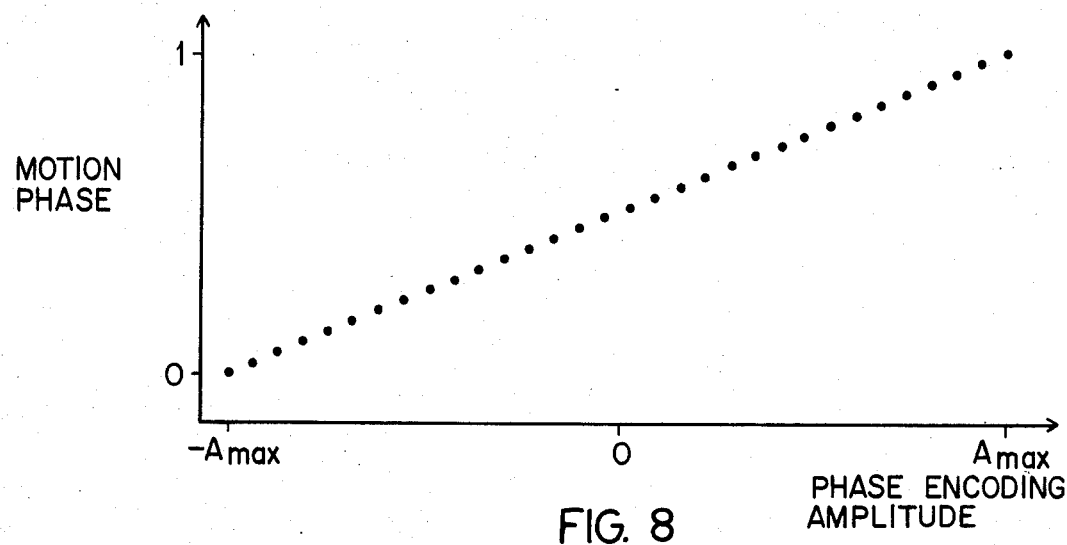
FIG. 8 illustrates a plot of motion phase versus phase-encoding amplitude for the embodiment discussed with reference to FIG. 6.

The objective of the low frequency sort mode is to implement a view order so that after the measurement data acquired in each view are reordered, the motion will appear to go through only one cycle. This can be achieved if, for example, as a result of the view order selected, motion phase is monotonically related to phase-encoding amplitude as is shown in FIG. 8 for the 32-view example. In an actual scan, the relationship of FIG. 8 may not be achieved perfectly, though that may be the goal. However, if it is approximated relatively well the disturbing effects on the image will be reduced. The relationship of FIG. 8 can be approximated if the view order of FIG. 6 is used. FIG. 6 shows the phase-encoding amplitude for each view and would be used instead of that of FIG. 3.

Figure 7:
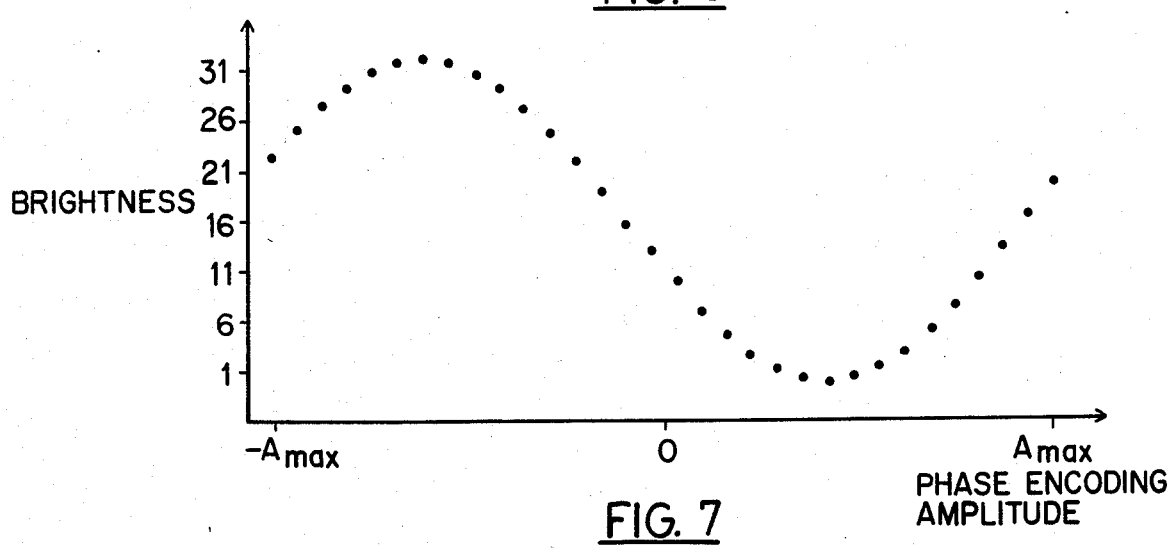
FIG. 7 shows objects brightness as a function of phase-encoding amplitude for the embodiment of FIG. 6.

It will be recognized that whatever order the views are implemented, the measured data will have to be reordered so as to make the phase-encoding amplitude be monotonic prior to reconstructing the image (i.e., taking the inverse Fourier transform in the 2FT method). When this is done for our example, the resulting brightness for each phase-encoding amplitude is as shown in FIG. 7. FIG. 7 is generated by looking up, for each view, a brightness value in FIG. 4 and a phase-encoding amplitude in FIG. 6. It will be seen that, whereas the brightness was varying at a rate of 3 cycles per scan, if a monotonic phase-encoding order is used (FIG. 4), by using the view order of FIG. 6, the apparent frequency has been changed to one cycle per scan (FIG. 7). As a result of making the motion appear to cover only one cycle during the scan, the ghosts should be within a few pixels of any source point. Structures far from moving objects should be undisturbed.

Another embodiment described in the aforementioned application is the "high frequency sort mode." In accordance with this embodiment, a phase-encoding gradient order is selected so that, after the data acquired with the various phase-encoding gradient amplitudes are reordered prior to reconstruction, the motion appears to be at the highest possible frequency. The motivation toward a high frequency sort is to improve the image quality in the neighborhood of the varying pixels by displacing the ghosts as far as possible.

Figure 9:
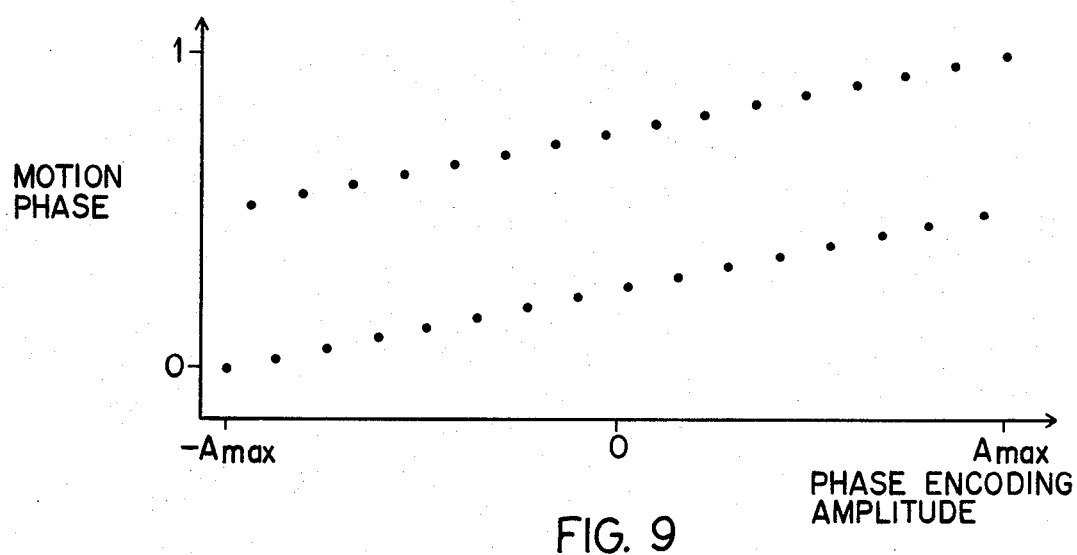
FIG. 9 shows the relationship between motion phase and phase-encoding amplitude for the high frequency sort mode embodiment of a prior method.
Figure 10:
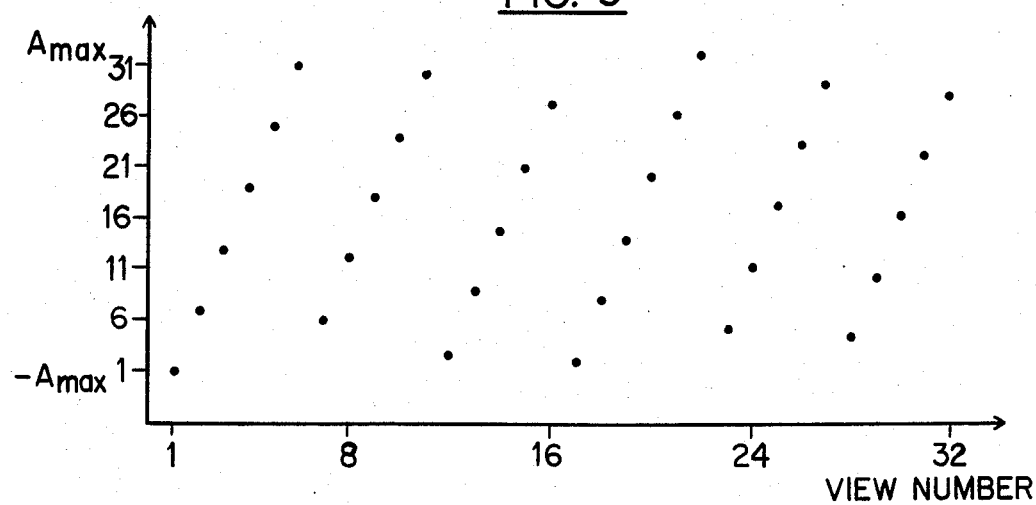
FIG. 10 depicts the order of phase-encoding amplitudes for the high frequency sort embodiment.
Figure 11:
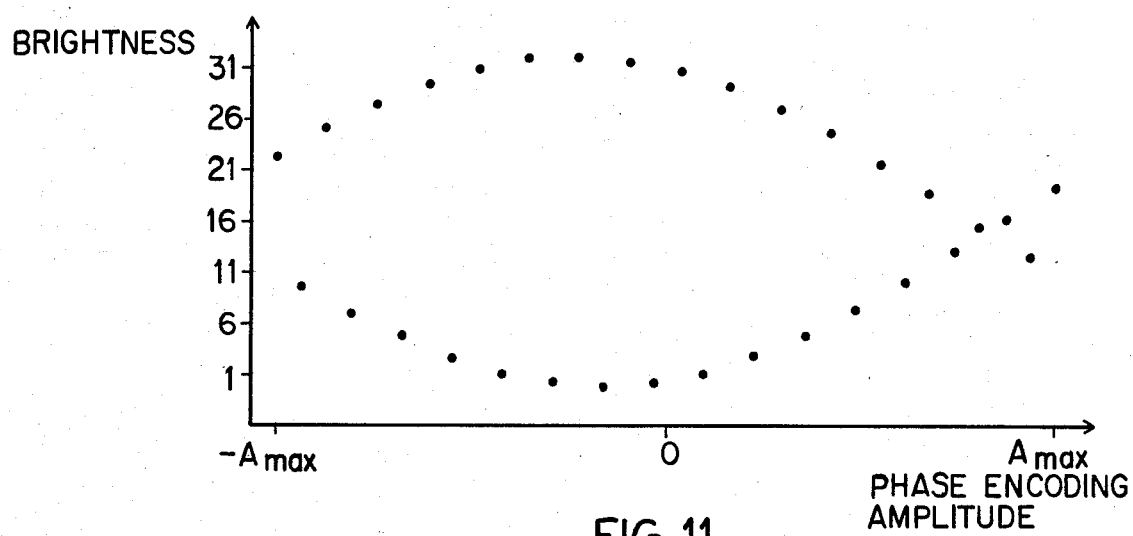
FIG. 11 shows the relationship between object brightness and phase-encoding amplitude for the high frequency mode embodiment.

Again, the desired final relationship between motion phase and phase encoding amplitude is first selected. One way to make the scan data represent a rapidly varying object is as shown in FIG. 9. It will be seen that the object will appear to vary by approximately one-half cycle between adjacent phase-encoding values. For the 32-view case, for example, one possible order of phase-encoding amplitudes is shown in FIG. 10. When the view order of FIG. 10 is combined with the brightness as a function of view number of FIG. 4 the relationship between brightness and phase-encoding shown in FIG. 11 is obtained. Because FIG. 11 has primarily high frequency components, the ghosts will be displaced as far as possible (FOV/2) from the source pixel.

Figure 12:
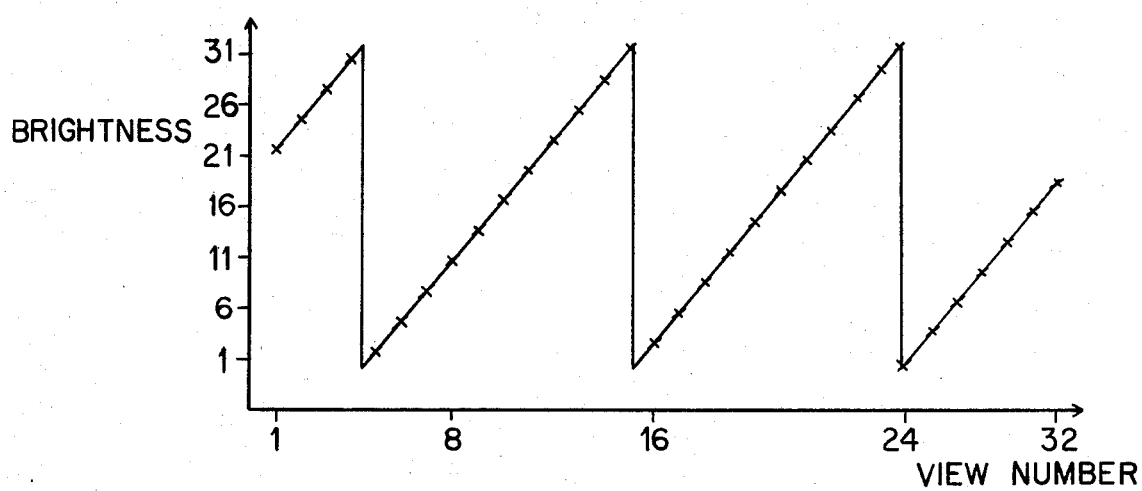
FIG. 12 illustrates several cycles of object brightness and having less symmetry than the waveform-depicted in FIG. 4.
Figure 13:
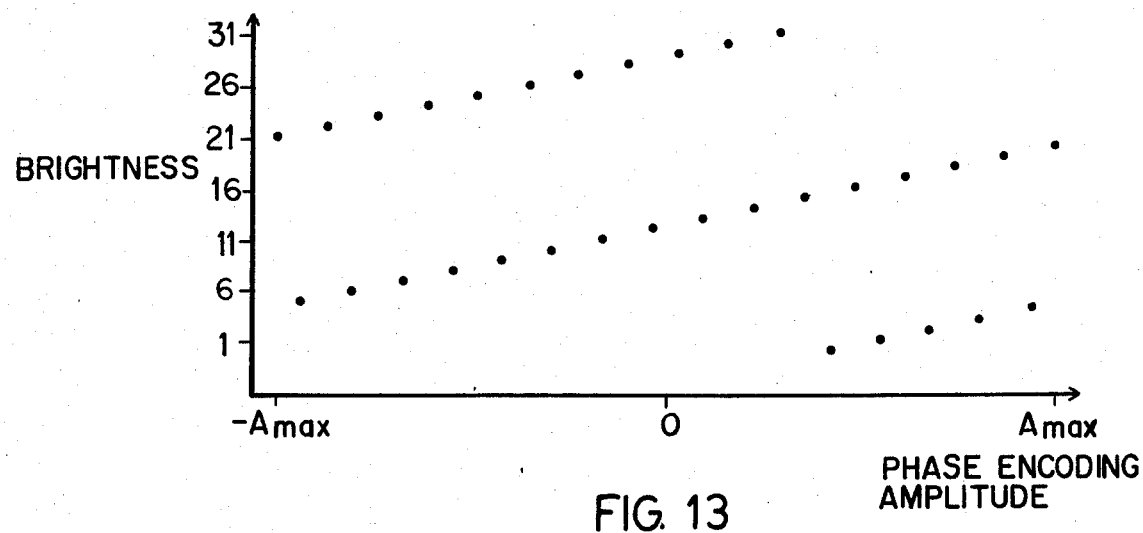
FIG. 13 shows the relationship between object brightness and phase-encoding amplitude for object brightness variation pattern depicted in FIG. 12.
Figure 14:
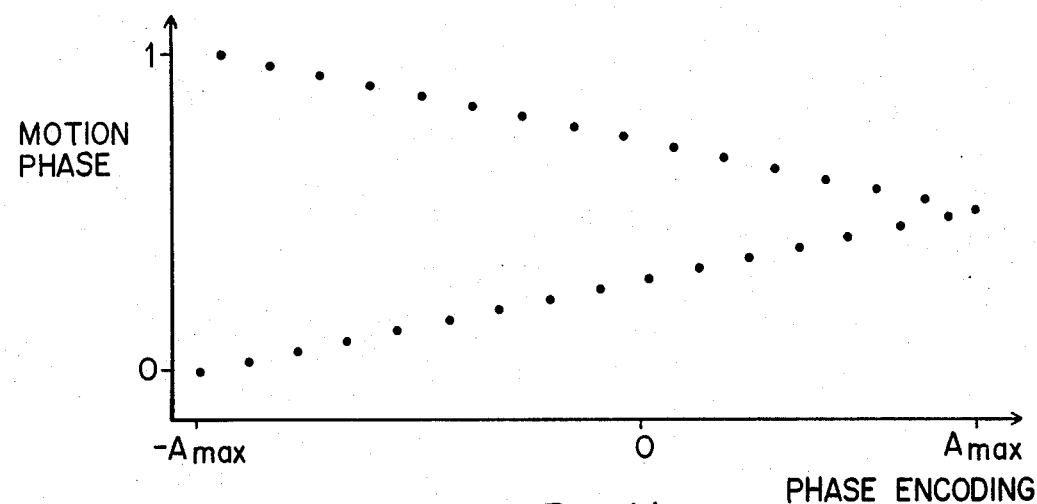
FIG. 14 shows the relationship between motion phase and phase-encoding amplitude for another high frequency sort embodiment.
Figure 15:
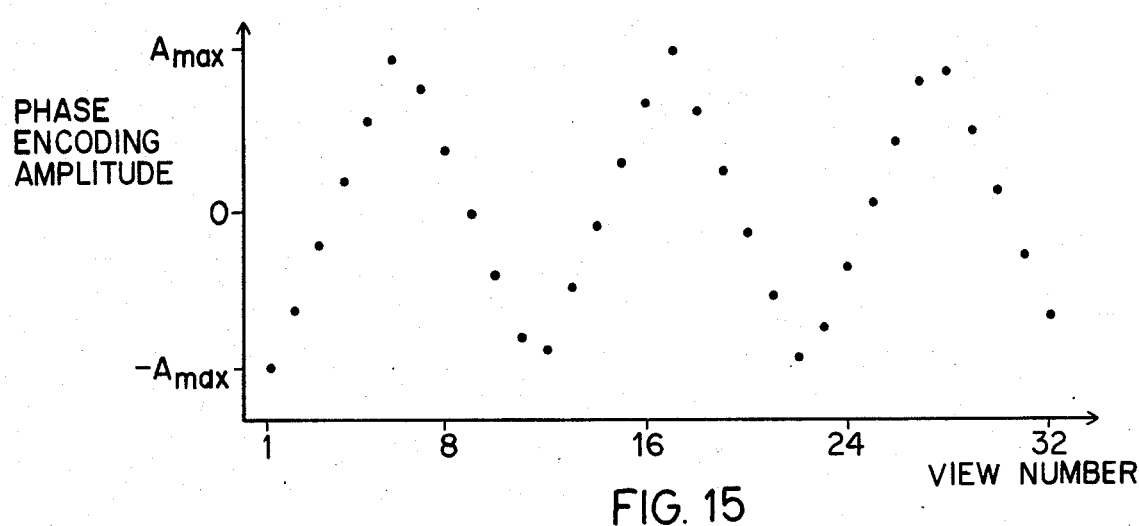
FIG. 15 depicts phase-encoding amplitude versus view number for the high frequency sort embodiment of FIG. 14.
Figure 16:
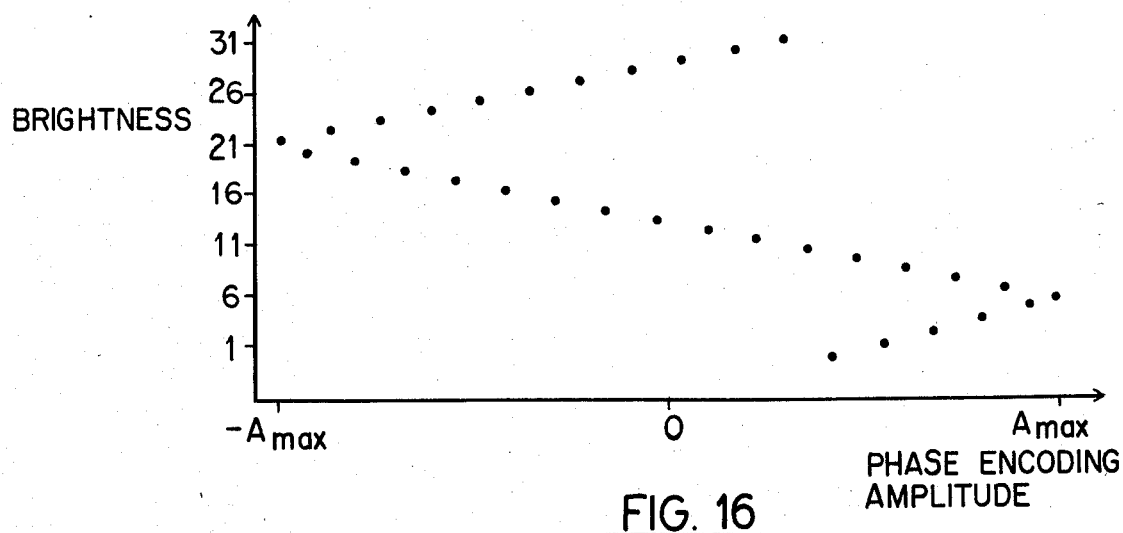

For a brightness variation pattern that has less symmetry than a sinusoid, the brightness as a function of phase encoding would still contain some low frequency content. For example, if the sine wave of FIG. 4 were replaced by the sawtooth of FIG. 12, the resulting relationship between brightness and phase encoding would be that shown in FIG. 13. Residual low frequency components can be seen in FIG. 13 as a slow upward trend from left to right. These residual low frequency components derive from the low frequency components in FIG. 9. While the strong high frequency components in FIG. 13 indicate that much of the ghost energy will be displaced far from the source pixel, the residual low frequency components will cause there to be some residual effects near the source pixel, although less than in a low frequency sort. This performance can be further improved by using the relationship between motion phase and phase encoding as shown in FIG. 14. The relationship of FIG. 14 can be approximated if the view order of FIG. 15 is used. If FIG. 15 is combined with the sawtooth variation of FIG. 12 the result will be FIG. 16 which shows decreased residual low frequency content. As a result, the neighborhood of the source pixel will be less contaminated with ghosts.

The high frequency sort method maximizes the distance between the object and the ghost, but unless the scanned field is significantly larger than the object's size, ghosts could still fall on the desired portions of the image. The scanned field of view may be increased by known techniques to provide space that does not contain interesting structures but into which ghosts can be thrown. During or after reconstruction this extra region can be discarded so that the ghosts will not be visible in the final image. The typical way to double the field of view is to double the number of views while the maximum phase-encoding amplitude $A_{max}$ is kept constant (the phase-encoding amplitude increment is halved). This ordinarily requires the scan time to be doubled if $T_R$ is kept constant.

A desired method for increasing the field of view, in particular for doubling the field of view, is disclosed and claimed in U.S. Pat. No. 4,612,504, filed Nov. 21, 1984 (assigned to the same assignee and which is incorporated herein by reference) and may be used to convert the factor of 2 normally alloted to removing signal baseline errors (the use of "chopper" pairs), as disclosed in previously referenced U.S. Pat. No. 4,443,760, into a doubling of the scanned field while still suppressing baseline effects. For example, instead of acquiring 128 chopper pairs, 256 views each with a single excitation can be acquired in which the scanned field of view is doubled. This method avoids the doubling of the scan time while it still allows the ghosts to be thrown outside the desired image region if a high frequency sort is used.

In both the low and high frequency sort embodiments, a situation may arise (because phase-encoding gradient amplitudes are not necessarily implemented monotonically) where a view employing a large amplitude phase-encoding gradient follows a view with a small amplitude phase-encoding gradient. Residual transverse magnetization resulting from the small amplitude phase-encoding pulse can corrupt the measurement from the large amplitude phase-encoding view with a concomitant deleterious effect on image quality. U.S. patent application Ser. No. 689,428, filed Jan. 7, 1985 (assigned to the same assignee as the present invention and which is incorporated herein by reference) discloses and claims a method for reducing the effects of residual transverse magnetization. One exemplary sequence for accomplishing this will be described next with reference to FIG. 17.

Figure 17:
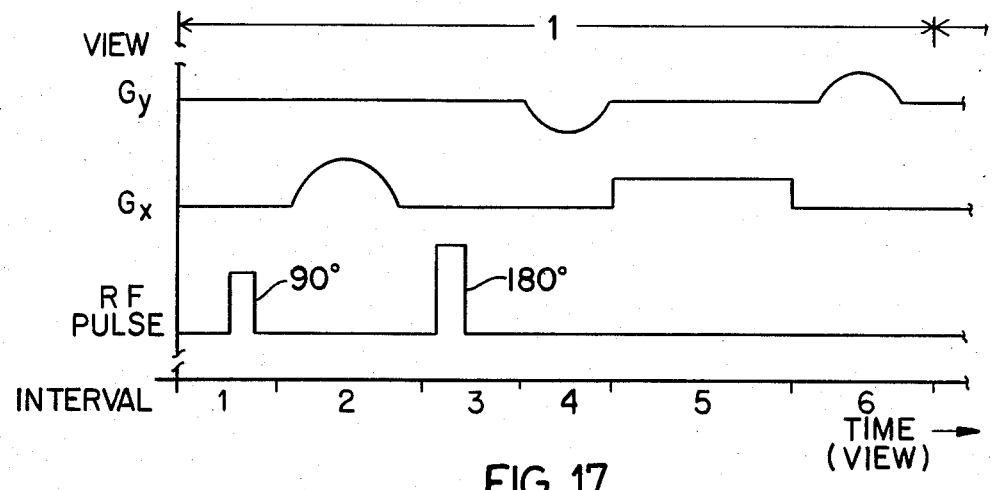
FIG. 17 depicts a portion of a pulse sequence useful with the invention to minimize the effects of residual transverse magnetization.

Referring now to FIG. 17, the deleterious effect of residual transverse magnetization due to imperfect 180° RF pulses is avoided by delaying the application of a phase-encoding $G_y$ gradient pulse until after the application of the 180° RF pulse in interval 3. Thus, the $G_y$ phase-encoding gradient pulse is applied in interval 4. Delaying the application of the phase-encoding pulse may increase the minimum echo delay time. However, the reversing $G_y$ pulse in interval 6 is highly effective in reversing the residual magnetization effects due to the $G_y$ pulse in interval 4. The result is that, regardless of the amplitude of the $G_y$ phase-encoding gradient pulse in interval 4, the magnetization is left in the same state following each view so that $G_y$ history does not affect the measurements.

In the example shown in FIG. 17, the reversing and phase-encoding gradient amplitudes are chosen so as to return the residual transverse magnetization to the state it would be in if no phase-encoding gradient had been used at all. In some applications, all that is required is that the residual transverse magnetization be left in the same state that is independent of the particular phase-encoding gradient amplitude used for that view. To do this, the sum of the amplitude of the phase-encoding gradient and the amplitude of the reversing gradient should be equal to a constant. In the example shown in FIG. 17, the constant has been chosen to be equal to zero. In any case, as the amplitude of the phase-encoding gradient varies, so does the amplitude of the reversing gradient.

It can be recognized that one key to the successful reduction of motion-induced artifacts is the choice of the order in which the phase-encoding gradient amplitudes are used. Returning now to the method by which this view order is selected, the methods described in the aforementioned application rely on substantial periodicity in the object's motion and a-priori knowledge of the motion frequency. This knowledge is used, along with the time between temporally sequential views (the view increment time selected by the operator or pre-set) to select a view order prior to acquisition of the scan data. Briefly, the known view increment time and the assumed motion period are used to calculate the relative motion phase at the time each view will be acquired. Using various sorting schemes, a unique phase-encoding amplitude is assigned to each view in a manner that will cause the desired relationship between relative motion phase and phase encoding to be satisfied as well as is possible. This method is ideal if the signal variations will indeed be periodic and at the assumed frequency. However, if the motion period differs from the assumed value or varies during the scan the efficiency of artifact reduction will be diminished.

In accordance with the present invention, the phase-encoding gradient amplitude in each view (in either the low-frequency sort mode or the high-frequency sort mode) is selected just prior to the start of the pulse sequence for that view and depends on the phase of the signal variation at that point in time. Thus, the final view order (i.e., the temporal order in which the phase-encoding amplitudes are implemented) depends on the measured phase during the scan. In this manner, the view order can be continuously adjusted to obtain optimum artifact reduction.

It is important to the invention that motion phase information be available during the entire scan. Since one important application of the invention relates to reduction of ghost artifacts due to patient motion caused by respiration, a respiration monitor is required to provide this information. Suitable apparatus and method for measuring and calculating motion phase will be described hereinafter. For the present, it will be assumed that information about motion phase is available. It will be recognized that respiratory motion is used for purposes of illustration, and that the invention is applicable to other types of signal variations described hereinbefore.

The invention will be described in detail as applied to the commonly used 2DFT imaging method. This is only as an example since, as will be described hereinbelow, the method is applicable to other imaging methods, such as 3DFT and multiple angle projection reconstruction.

Selection of the sort mode (e.g., high frequency sort or low frequency sort) and the number of views or phase-encoding gradient amplitude values to be used in the scan defines the desired relationship between motion phase and phase-encoding amplitude. For example, FIGS. 8, 9 and 14 show three possible relationships for the 32-view case. It can be seen that the desired relationship is defined at a finite number of discrete points in motion phase, typically equal to the number of views to be acquired, and for each discrete value of motion phase there is a unique corresponding phase-encoding amplitude. Prior to the initiation of the scan, the desired relationship is tabulated by motion phase. Thus, the table contains an entry for each of a finite set of values of respiratory phase, each entry containing the desired phase-encoding amplitude value.

Immediately before the start of the pulse sequence for the first view, a reading of the motion phase is taken by the respiration monitor. In general, the motion phase may not be equal to the motion phase of one of the entires in the table. If it does, the corresponding phase-encoding value is selected. If it does not correspond exactly to one of the entries, the entry whose motion phase is closest to the measured motion phase is selected. In either case, a phase-encoding amplitude value is selected and implemented in the pulse sequence of the view to be played out immediately. The table entry that was selected and was just used is removed from the table.

Immediately prior to the beginning of the pulse sequence for the second view another reading of the respiration monitor is taken and a phase-encoding value is selected from those remaining in the table by choosing the one whose corresponding ideal motion phase is closest to the measured motion phase. The selected phase-encoding amplitude is used and the corresponding table entry is deleted. The process continues in this way until all views (and all phase-encoding amplitudes) are taken. The method just described will be referred to as the "normal scan" method to be differentiated from the "overscan" method to be described below. As the views are acquired, note is made of the order in which the phase-encoding amplitudes were used since the scan data must be recorded prior to or as part of the image reconstruction calculations. Also, note can be made of the motion phase error for each view. The motion phase error is the difference between the ideal motion phase for the selected phase-encoding amplitude and the actual measured motion phase.

In general, views acquired early in the scan will have very small respiratory phase errors since many table entries are available from which the nearest is selected. Toward the end of the scan, however, fewer and fewer entries are available and so, in general, the phase errors become larger. At the time of the last acquisition there is only one entry left in the table and this phase-encoding amplitude will be selected regardless of the actual respiratory phase. Thus, there may be some views, those acquired toward the end of the scan, that have rather substantial respiratory phase errors. It has been found that this is not disastrous since by far most views have very small errors and they form the basis for the desired relationship between respiratory phase and phase encoding. However, some benefit can be achieved if these large errors are reduced.

Error reduction is accomplished by employing an "overscan" capability. In the overscan mode, the number of acquisitions (view measurements) is increased by some amount, e.g., 20, while the number of phase-encoding amplitude values or reconstruction views (i.e., the 128, 256 or 512 needed for image reconstruction) is left unchanged. The overscan views are used to reduce the respiratory phase errors. One way to accomplish this is to first acquire data for all phase-encoding amplitudes as described above and noting for each the absolute value of the respiratory phase error. After the "normal scan" process is completed, the additional overscan views are acquired. Immediately prior to the initiation of the pulse sequence for each overscan view, a respiration sample of the montor is taken. For each phase-encoding amplitude value, the respiratory phase error that would result if that gradient value were used is calculated by subtracting the current respiratory motion phase from the ideal respiratory motion phase for that gradient amplitude. The amount by which the respiratory motion phase error for this gradient amplitude value would be reduced (the improvement) is calculated by substracting the absolute value of the respiratory phase error just calculated from the absolute value of the phase error that resulted from the prior acquisition using this gradient amplitude. The phase-encoding gradient amplitude of the view whose error is reduced the most (the one with the largest improvement) is selected and played out. Note is made of the value selected and, assuming that the new phase error is smaller than the oil phase error, not is made of the new phase error. For image reconstruction only the data acquired with the smallest motion phase error for each phase-encoding amplitude is used.

In light of the foregoing disclosure, other methods and modifications will be evident to those skilled in the art. Thus, the overscan views and the "normal" views could be intermingled. For example, if the phase-encoding amplitude selected by the "normal scan" method would result in a large respiratory phase error but the current respiratory phase would result in a substantial improvement to a previously used gradient value an overscan view could be acquired and the completion of the "normal scan" could be delayed.

As was discussed before, there are applications in which it is desirable to combine several measurements made at the same phase encoding for purposes of improving the signal-to-noise ratio and/or subtracting baseline effects. One way this can be accommodated is to acquire all of the measurements that will be combined sequentially one right after the other, all after a single respiratory phase sample. However, if this is done the various measurements will have been acquired at respiratory phases that differ by some uncontrolled amount. More consistent results are obtained if all the measurements are acquired at controlled respiration phases. For example, it may be desirable to have all the component measurements made at the same respiratory phase. This can be done if, for example, after a particular phase-encoding amplitude value is selected for the first time, the table entry is not discarded. Rather, note is made that the particular phase-encoding value has been used once. Since the phase-encoding value is still in the table, whenever a sample is made at an appropriate respiratory phase, the phase-encoding value can be used again. Only after the requisite number of measurements are collected is the table entry discarded. Equivalently, multiple table entries could be made for each phase-encoding amplitude. In other applications, it may be desirable to purposefully make the component measurements for one view at different but known respiratory phases, since this may reduce the motion-related inconsistencies between views. In other words, inconsistencies between views are the source of motion-related artifacts. To the extent that each view more closely reflects the "average" object position (for example, by combining measurements at different motion phases to make up each view) view-to-view inconsistencies will be diminished. To accomplish this, multiple table entries would be made for each view, one entry for each component pulse sequence. In any case, the different measurements and their corresponding respiratory phase errors must be kept track of separately. It should be recalled that it is the signal variation as a function of gradient parameters that determines the character of the artifacts. If multiple pulse sequences are implemented for each gradient parameter value, it is the signal variations averaged over these multiple pulse sequences that defines the artifacts' characteristics.

In some applications it may not be necessary, possible or desirable to measure the motion phase immediately prior to each view. It should be clear that the present invention may be advantageously practiced if phase measurements are made at various points during the scan and the view order selection is based on these measurements, for example, by extrapolating from the measured values, phase values for views for which measurements are needed.

The view orders shown in FIGS. 6, 10, and 15 were generated using the methods of the aforementioned patent application which rely on a-priori knowledge of the motion period. The view orders that would be generated by the present method would be somewhat different. If the motion is indeed periodic at the assumed frequency, the use of the a-priori knowledge produces a superior result since the relative respiratory phase at the time each view is acquired can be predicted ahead of time and the phase-encoding amplitudes can be assigned optimally. However, the present method is superior in the more commonly encountered situations where the motion is not perfectly periodic since the phase-encoding amplitudes are assigned while the scan data is being acquired and so the method can adjust to varying motion period.

For ideal operation of the new order selection methods described above, the distribution of respiration phases should be uniform. That is, all phase values should be equally likely to occur on the average since there is a one-to-one mapping of respiratory phase to gradient amplitude. Thus, reasonable requirements for any method for generating respiration phases is that all output values be equally likely and that, if the respiratory phase values at two points in time are close, then the object's spatial orientation at those times must also be similar.

Figure 18:
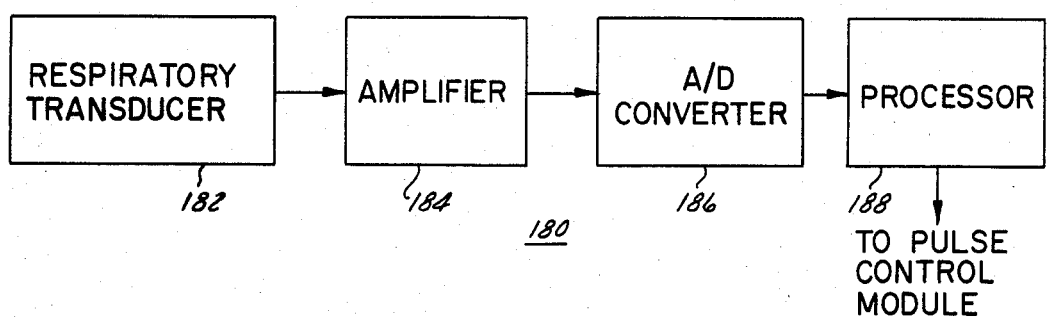
FIG. 18 depicts in block schematic form a system for supplying respiratory phase values.

A system, generally designated 180, capable of supplying respiratory phase values is shown in block schematic form in FIG. 18. The system is composed of a respiratory transducer 182 which conveniently may be a pneumatic bellows or pressure sensor for providing an electrical output signal to an amplifier 184 in response to pressure changes in the bellows. The amplified signal is digititized in an analog-to-digital (A/D) converter 186 and applied to processor 188 which calculates the needed phase values. The phase value computed by the processor is applied to PCM 112 (FIG. 1) which then generates the correct amplitude of the phase-encoding gradient as described above. The PCM supplies the computer 110 with the view order for image reconstruction purposes.

Figure 19:
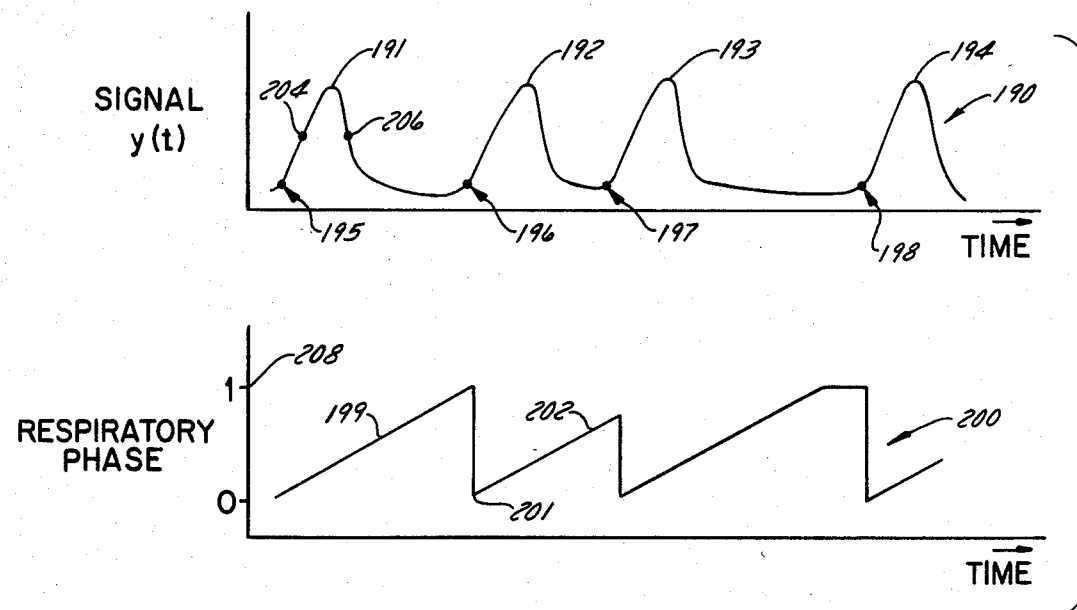
FIG. 19 shows a plot of a representative respiratory cycle curve as a function of time.

FIG. 19 shows a plot of a representative respiratory cycle curve 190 showing the signal y(t) that might be measured using a respiration monitor as a function of time. Four breath cycles are shown in curve 190. Signal peaks 191–194 correspond to peak inspiration when the lungs are expanded while the shallow plateaus of low signal level between the peaks correspond to end expiration.

One way to generate respiration phase values is to recognize a feature in waveform 190, for example, fiducial points labelled 195–198 in FIG. 19. Well-known signal processing methods can be used to recognize these points. Points 195–198 are assigned the same respiratory phase values, for example, zero. It is desired to assign phase values to points between the points labelled 195 and 196, 196 and 197, and 197 and 198. Points between points 195 and 196 are assigned monotonically increasing phase values, as indicated by segment 199 of phase waveform 200 shown below curve 190 in FIG. 19. The slope of curve segment 199 is inversely proportional to the average respiration period. The average respiratory period can be calculated from the previous several (e.g., 4) breaths. When the next fiducial point 196 is detected, the phase is reset to zero; e.g., at point 201 of phase curve 200. A new average respiration period can be calculated using the newly finished breath as an additional point. After point 196 the output phase again increases linearly in segment 202 of curve 200. The process continues in this way, assigning all points a phase value proportional to the time since the previous fiducial point.

Because not all breaths are of equal length, a shorter-than-average breath, such as the one between points 196 and 197, may be observed. It can be appreciated that the phase will be reset to zero prior to its reaching its expected maximum value. Some breaths, such as the one between points 197 and 198, may be longer than expected. In these cases the phase values may have to be restricted to not rise above some value identified by numeral 208 on phase curve 200. This method can provide the sorting scheme instantaneous estimates of respiration phase, even though errors will result if breaths either longer or shorter than expected are observed. However, these errors will be small for small period variations. Also, since the method does rely on actual signal features and automatically adjusts for trends in the respiration period, errors should be short lasting.

Improved performance could be achieved if more than one fiducial point per cycle is recognized. For example, the points labelled 191–194 could be recognized and assigned the same phase value, the value being proportional to the fraction of the period encompassed between the two fiducial points. Using the additional fiducial points the occurrence of a breath that is shorter or longer than average can be detected earlier and errors can be minimized.

A method that reacts more quickly to changes in the repiration pattern would be preferred. Also, there is more information contained in the respiration waveform than is extracted by detection of one or a few fiducial points. For example, the points labelled 204 and 206 represent similar object orientations even though these points are on opposite sides of peak inspiration. A method capable of using this information would be useful. However, the measured waveform cannot be used directly since the waveform amplitude is different for different individuals, and also because some waveform values, such as those in end expiration, occur more often than others. Thus, before a waveform such as 190 can be used it must be processed so as to meet the requirements of the view order calculation method. Such a processing method will now be described.

A transfer function is calculated from the preceding one or several breath periods which relates the output phase to the input signal. The approach taken is based on the requirement that the frequency distribution of output phases should be uniform even though the input distribution may not be.

Figure 20:
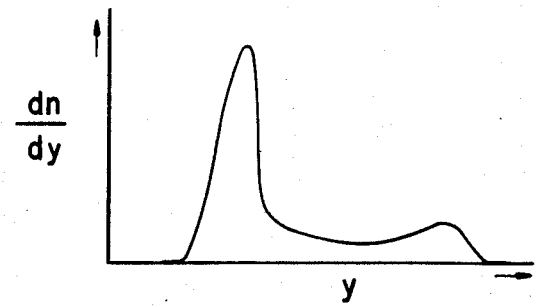
FIG. 20 illustrates a frequency histogram for the respiratory waveform of FIG. 18.

Let y(t), $-T \leq t \leq 0$ be a set of measurements of the breathing signal as a function of time over the previous T seconds. Further, let $h(y) = dN(y)/dy$ be the probability density function for y(t), i.e., dN/dy is the number of occurrences of the signal with amplitudes between y and y+dy. This function is also known as the frequency histogram of y(t). The frequency histogram for curve 190 (FIG. 19) is shown in FIG. 20. The non-uniform histogram of y(t) is easily seen. It is desired to map these signals to the desired phase range, for example, 0 to 1. One mathematical method that can be used for this purpose is known as histogram equalization. According to this method, the desired phase transfer function $\phi(y)$ is given by $$\phi(y) = \frac{1}{N_o} \int_{-\infty}^{y} h(y')dy'. \quad (11)$$

where $N_o$ is a normalization $$N_o = \int_{-\infty}^{\infty} h(y')dy'. \quad (12)$$

Next, it will be shown that the probability density $dN/d\phi$ for the phase $\phi$ is uniform, as desired, when the input is $y(t)$. Application of the chain rule yields:

$$\frac{dN}{d\phi} = \frac{dN}{dy} \cdot \frac{dy}{d\phi} \quad (13)$$

$$= \frac{dN}{dy} \bigg/ \frac{d\phi}{dy}.$$

From Equation (11), $$d\phi/dy = \frac{1}{N_o} \frac{dN}{dy} \quad (14)$$

Thus, from Equations (13) and (14), $$\frac{dN}{d\phi} = \frac{dN}{dy} \bigg/ \left( \frac{1}{N_o} \frac{dN}{dy} \right) \quad (15)$$

$$= N_o,$$

which is indeed a constant. Thus $\phi(y)$ satisfies the requirement that when the input signal is accurately described by the histogram of the preceding interval, the histogram of the output measure $\phi = \phi(y)$ will span the phase interval (0 to 1) with uniform frequency density.

Equation (11) can also be intuitively thought of as setting $\phi(y_o)$ equal to the fraction of the time that $y(t)$ has an amplitude less than $y_o$. In a discrete implementation, Equation (11) then can be rewritten as $$\phi(y) = (N_L + \tfrac{1}{2}N_E)/N_T, \quad (16)$$

where $N_T$ is the number of readings in T seconds, while $N_L$ is the number of readings in the previous T seconds whose amplitude is less than y and $N_E$ is the number of readings in the previous T seconds whose amplitude is equal to y. Note that with this approach, the histogram is never really generated. Instead, the required point in the integral histogram is generated when it is needed.

Thus, the method is described by the following:
(1) Some number, for example, 1000 samples of the respiration waveform (190 in FIG. 19) are acquired and stored in a buffer.

The following is then performed for every subsequent sample, which, for example, occurs during the imaging sequence.
(2) The new sample $y(t)$ is acquired and stored in the data buffer. If necessary, the oldest sample in the buffer is discarded.
(3) $y(t)$ is compared with the previous samples, $N_L$ and $N_E$ are calculated, and the phase is computed using Equation (16).

Note, therefore, that in effect the probability distribution function is continually updated during the scan so that slow changes in the respiration pattern are accommodated.

The preferred embodiments of the invention have been disclosed hereinabove with reference to a 2DFT imaging sequence. The invention is, however, not so limited and may in fact be advantageously applied to other imaging pulse sequences such as, for example, the well-known two-dimensional (2D) and three-dimensional (3D) implementations of multiple angle projection reconstruction technique. Although the discussion will be limited to 2D projection reconstruction, the generalization to 3D will be understood by those skilled in the art. In 2D projection reconstruction NMR imaging, projection measurements are made at many (usually equally spaced) angles in a 180 degree arc. For example, projection data could be measured at one degree increments. For each of these projection measurements or views, the readout gradient direction is perpendicular to the desired projection direction. Thus, the parameter that varies from view to view is the direction of the readout gradient (analogous to the phase-encoding amplitude in 2D FT imaging). The image is reconstructed by filtering and back projecting the line integral data obtained for each direction. In projection reconstruction, it is well known from computerized tomography (CT) scanning art that inconsistencies in the projection data, for example those due to periodic motion, are usually manifested in the image as streaks tangential to the moving (or otherwise varying) object. However, it is known that the reconstruction process is relatively insensitive to motion (or other variation) that appears as a single full cycle as a function of projection direction. The method of the invention is directly applicable to the multiple projection data if the projection angle is treated in a manner analogous to that of the phase-encoding gradient described hereinabove. For projection reconstruction, the low frequency sort method is preferred. That is, the projection measurements, rather than being acquired sequentially at one degree intervals, are acquired in a low frequency sort order sort so that a plot of pixel brightness versus projection angle is similar to that of FIG. 7. As before, the goal with low frequency sort is to select projection directions so that the motion period appears to be equal to scan time. If the number of views used in projection reconstruction is comparable to or larger than the number of pixels across the field of view, the high frequency sort method may also be used, since for this case it is known that the consistent rapid variation between adjacent views will cause streaks in the reconstructed image that will be visible only far from the source pixel.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

What is claimed is:

1. A method for reducing artifacts in a desired image due to substantially periodic signal variations while a portion of an object is being examined using nuclear magnetic resonance techniques, which techniques include measurement of imaging data about the object portion through the implementation of a plurality of views, each made up of at least one pulse sequence which includes irradiation of the object portion by an RF excitation pulse at the Larmor frequency to produce an NMR signal, application of a pulsed magnetic field gradient along at least one dimensional axis of the object, and acquisition of imaging data, said magnetic field gradient having a parameter value adjustable to have a different value in each view so as to encode spatial information into the NMR signal, said method comprising:

(a) Selecting a predetermined relationship between the signal variations and the parameter value of said magnetic field gradient, wherein selection of said relationship defines a correspondence between a desired parameter value to be implemented in a given pulse sequence and the phase of said signal variations;

(b) measuring the phase of said signal variations in the course of implementing said plurality of views; and (c) selecting a non-monotonic temporal order of application of said magnetic field gradient so as to approximate said predetermined relationship, wherein said order is based on said phase measurements, thereby to reduce artifacts in said desired image.

2. The method of claim 1 wherein said signal variations are due to motion of the object being studied.

3. The method of claim 1 wherein said pulsed magnetic field gradient comprises a phase-encoding magnetic field gradient and wherein the adjustable parameter value comprises the time integral of the gradient pulse waveform.

4. The method of claim 3 wherein said time integral is controlled by the amplitude of said phase-encoding magnetic field gradient.

5. The method of claim 1 wherein said magnetic field gradient comprises a read-out magnetic field gradient and wherein the adjustable parameter value comprises the direction of said read-out gradient.

6. The method of claim 1 wherein the temporal order of said gradient parameter value applied in the course of implementing said plurality of views is selected such that said signal variations as a function of monotonically increasing gradient parameter value, averaged within each view, for views having more than one pulse sequence, are of a lower frequency than the actual frequency of the periodic signal variation, thereby to decrease displacement of the artifacts from the desired image.

7. The method of claim 6 wherein the temporal order of said gradient parameter applied in the course of implementing said plurality of views is selected such that when the measurements acquired in each pulse sequence are rearranged in order of monotonically increasing parameter value the signal variations, averaged within each view, for views with more than one pulse sequence, will appear to go through no more than one cycle.

8. The method of claim 1 wherein the temporal order of said gradient parameter applied in the course of implementing said plurality of views is selected such that said signal variations as a function of monotonically increasing gradient parameter value, averaged within each view, for views having more than one pulse sequence, are of a higher frequency than the actual frequency of the periodic signal variation, thereby to increase displacement of the artifacts from the desired image.

9. The method of claim 8 wherein the temporal order of said gradient parameter applied in the course of implementing said plurality of views is selected such that when the measurements acquired in each pulse sequence are rearranged in order of monotonically increasing parameter value the signal variations, averaged within each view, for views having more than one pulse sequence, will appear to go through $N_v/2$ cycles, where $N_v$ is equal to the number of views comprising said plurality of views.

10. The method of claim 1 wherein, prior to the implementation of each pulse sequence, the phase of said signal variations is measured and a parameter value to be used is selected, wherein said selected parameter value depends on said phase measurement.

11. The method of claims 1, 3, 5, 8 or 10 wherein said step of selecting said predetermined relationship includes tabulating for a finite set of values of phase of said signal variations an entry containing the desired value of said gradient parameter and selecting the number of measurements to be made with each tabulated entry; and wherein said step of selecting a temporal order comprises selecting from said tabulation the entry having a phase of signal variation closest to the phase of signal variation at the time the pulse sequence is implemented and wherein each entry in said tabulation is deleted after the requisite number of measurements with that entry have been made.

12. A method for reducing artifacts in a desired image due to substantially periodic signal variations while a portion of an object is being examined using nuclear magnetic resonance techniques, which techniques include measurement of imaging data about the object portion through the implementation of a plurality of views, each made up of at lease one pulse sequence which includes irradiation of the object portion by an RF excitation pulse at the Larmor frequency to produce an NMR signal, application of a pulsed magnetic field gradient along at least one dimensional axis of the object, and acquisition of imaging data, said magnetic field gradient having a parameter value adjustable to have a different value in each view so as to encode spatial information into the NMR signal, said method comprising:

(a) Selecting a predetermined relationship between the signal variations and the parameter value of said magnetic field gradient, wherein selection of said relationship defines a correspondence between a desired parameter value to be implemented in a given pulse sequence and the phase of said signal variations, and wherein said relationship is such that when the measurements of imaging data acquired in each pulse sequence are rearranged in order of monotonically increasing parameter value, the signal variations, averaged within each view, for views having more than one pulse sequence as a function of monotonically increasing gradient parameter are at a lower frequency than the actual frequency of the signal variations;

(b) measuring the phase of said signal variations in the course of implementing said plurality of views; and (c) selecting a non-monotonic temporal order of application of said magnetic field gradient so as to approximate said predetermined relationship, wherein said order is based on said phase measurements, thereby to reduce artifacts in said desired image.

13. The method of claim 12 wherein said signal variations are due to motion of the object being studied.

14. The method of claim 12 wherein said pulsed magnetic field gradient comprises a phase-encoding magnetic field gradient and wherein the adjustable parameter value comprises the time integral of the gradient pulse waveform.

15. The method of claim 14 wherein said time integral is controlled by the amplitude of said phase-encoding magnetic field gradient.

16. The method of claim 12 wherein said magnetic field gradient comprises a read-out magnetic field gradient and wherein the adjustable parameter value comprises the direction of said read-out gradient.

17. The method of claim 12 wherein the temporal order of said gradient parameter applied in the course of implementing said plurality of views is selected such that when the measurements acquired in each pulse sequence are rearranged in order of monotonically increasing parameter value the signal variations, averaged within each view for views having more than one pulse sequence, will appear to go through no more than one cycle.

18. The method of claim 12 wherein, prior to the implementation of each pulse sequence, the phase of said signal variations is measured and a parameter value to be used is selected, wherein said selected parameter value depends on said phase measurement.

19. The method of claims 12, 14, 16 or 18 wherein said step of selecting said predetermined relationship includes tabulating for a finite set of values of phase of said signal variations an entry containing the desired value of said gradient parameter and selecting the number of measurements to be made with each tabulated entry; and wherein said step of selecting a temporal order comprises selecting from said tabulation the entry having a phase of signal variation closest to the phase of signal variation at the time the pulse sequence is implemented and wherein each entry in said tabulation is deleted after the requisite number of measurements with that entry have been made.

20. A method for reducing artifacts in a desired image due to substantially periodic signal variations while a portion of an object is being examined using nuclear magnetic resonance techniques, which techniques include measurement of imaging data about the object portion through the implementation of a plurality of views, each made up of at least one pulse sequence which includes irradiation of the object portion by an RF excitation pulse at the Larmor frequency to produce an NMR signal, application of a pulsed magnetic field gradient along at least one dimensional axis of the object, and acquisition of imaging data, said magnetic field gradient having a parameter value adjustable to have a different value in each view so as to encode spatial information into the NMR signal, said method comprising:

(a) Selecting a predetermined relationship between the signal variations and the parameter value of said magnetic field gradient, wherein selection of said relationship defines a correspondence between a desired parameter value to be implemented in a given pulse sequence and the phase of said signal variations, and wherein said relationship is such that when the measurements of imaging data acquired in each pulse sequence are rearranged in order of monotonically increasing parameter value, the signal variations, averaged within each view, for views with more than one pulse sequence, as a function of gradient parameter are at a higher frequency than the actual frequency of the signal variations;

(b) measuring the phase of said signal variations in the course of implementing said plurality of views; and (c) selecting a non-monotonic temporal order of application of said magnetic field gradient so as to approximate said predetermined relationship, wherein said order is based on said phase measurements, thereby to reduce artifacts in said desired image.

21. The method of claim 20 wherein said signal variations are due to motion of the object being studied.

22. The method of claim 20 wherein said pulsed magnetic field gradient comprises a phase-encoding magnetic field gradient and wherein the adjustable parameter value comprises the time integral of the gradient pulse waveform.

23. The method of claim 22 wherein said time integral is controlled by the amplitude of said phase-encoding magnetic field gradient.

24. The method of claim 20 wherein said magnetic field gradient comprises a read-out magnetic field gradient and wherein the adjustable parameter value comprises the direction of said read-out gradient.

25. The method of claim 20 wherein the temporal order of said gradient parameter applied in the course of implementing said plurality of views is selected such that when the measurements acquired in each pulse sequence are rearranged in order of monotonically incrasing parameter value the signal variations, averaged within each view, for views having more than one pulse sequence, will appear to go through $N_v/2$ cycles, where $N_v$ is equal to the number of views comprising said plurality of views.

26. The method of claim 20 wherein, prior to the implementation of each pulse sequence, the phase of said signal variations is measured and a parameter value to be used is selected, wherein said selected parameter value depends on said phase measurement.

27. The method of claims 20, 22, 24 or 26 wherein said step of selecting said predetermined relationship includes tabulating for a finite set of values of phase of said signal variations an entry containing the desired value of said gradient parameter and selecting the number of measurements to be made with each tabulated entry; and wherein said step of selecting a temporal order comprises selecting from said tabulation the entry having a phase of signal variation closest to the phase of signal variation at the time the pulse sequence is implemented and wherein each entry in said tabulation is deleted after the requisite number of measurements with that entry have been made.

28. A method for reducing artifacts in a desired image due to substantially periodic signal variations while a portion of an object is being examined using nuclear magnetic resonance techniques, which techniques include measurement of a set of imaging data about the object portion through the implementation of a plurality of views, each made up of at least one pulse sequence which includes irradiation of the object portion by an RF excitation pulse at the Larmor frequency to produce an NMR signal, application of a pulsed magnetic field gradient along at least one dimensional axis of the object, and acquisition of imaging data, said magnetic field gradient having a parameter value adjustable to have a different value in each view so as to encode spatial information into the NMR signal, said method comprising:

(a) Selecting a predetermined relationship between the signal variations and the parameter value of said magnetic field gradient, wherein selection of said relationship defines a correspondence between a desired parameter value to be implemented in a given pulse sequence and the phase of said signal variations;

(b) measuring the phase of said signal variations in the course of implementing said plurality of views;

(c) selecting a non-monotonic temporal order of application of said magnetic field gradient so as to approximate said predetermined relationship, wherein said order is based on said phase measurements; and (d) selecting a subset of the imaging data acquired as a result of implementing said pulse sequences, said subset being smaller than the full set of imaging data, wherein the pulse sequences from which imaging data measurements are included in said subset are selected so as to more closely approximate said predetermined relationship, said subset being sufficient for constructing said desired image, thereby to reduce artifacts in said desired image.

29. The method of claim 28 wherein said signal variations are due to motion of the object being studied.

30. The method of claim 28 wherein said pulsed magnetic field gradient comprises a phase-encoding magnetic field gradient and wherein the adjustable parameter value comprises the time integral of the gradient pulse waveform.

31. The method of claim 30 wherein said time integral is controlled by the amplitude of said phase-encoding magnetic field gradient.

32. The method of claim 25 wherein said magnetic field gradient comprises a read-out magnetic field gradient and wherein the adjustable parameter value comprises the direction of said read-out gradient.

33. The method of claim 28 wherein the temporal order of said gradient parameter value applied in the course of implementing said plurality of views is selected such that said signal variations as a function of monotonically increasing gradient parameter value, for the pulse sequences from which imaging data is included in said subset, are such that said signal variations as a function of monotonically increasing gradient parameter value, averaged within each view for views having more than one pulse sequence, are of a lower frequency than the actual frequency of said periodic signal variations.

34. The method of claim 33 wherein the temporal order of said gradient parameter applied in the course of implementing said plurality of views is selected such that said signal variations as a function of monotonically increasing gradient parameter value, for the pulse sequences from which imaging data is included in said subset, are such that said signal variations as a function of monotonically increasing gradient parameter value, averaged within each view for views having more than one pulse sequence, will appear to go through no more than one cycle.

35. The method of claim 28 wherein the temporal order of said gradient parameter applied in the course of implementing said plurality of views is selected such that said signal variations as a function of monotonically increasing gradient parameter value, for the pulse sequences from which imaging data is included in said subset, are such that said signal variations as a function of monotonically increasing gradient parameter value, averaged within each view for views having more than one pulse sequence, are of a higher frequency than the actual frequrncy of the periodic signal variations, thereby to increase displacement of the artifacts from said desired image.

36. The method of claim 35 wherein the temporal order of said gradient parameter applied in the course of implementing said plurality of views is selected such that said signal variations as a function of monotonically increasing gradient parameter value, for the pulse sequences from which imaging data is included in said subset, are such that said signal variations as a function of monotonically increasing gradient parameter value, averaged within each view for views having more than one pulse sequence, will appear to go through $N_v/2$ cycles, where $N_v$ is equal to the number of views comprising said plurality of views.

37. The method of claim 28 wherein, prior to the implementation of each pulse sequence, the phase of said signal variations is measured and a parameter value to be used is selected, wherein said selected parameter value depends on said phase measurement.

38. The method of claims 28, 30, 32, 33 or 37 further comprising the step of calculating a phase error for each pulse sequence, said phase error being equal to the difference between the phase of said signal variations at the time the pulse sequence was implemented and the phase of said signal variations corresponding to the gradient parameter value used, said correspondence being defined by said predetermined relationship.

39. The method of claims 38 wherein said step of selecting said predetermined relationship includes tabulating for a finite set of discrete values of phase of said signal variations an entry containing the desired value of said gradient parameter and selecting the number of measurements to be made with each tabulated entry; and wherein said step of selecting a temporal order comprises:

(a) Selecting, for at least one of said pulse sequences, the entry from said tabulation having a phase of signal variation closest to the phase of signal variation at the time the pulse sequence is implemented and wherein each entry in said tabulation is deleted after the requisite number of measurements with that entry have been made; and (b) selecting, for at least one of said pulse sequences, a value of said gradient parameter such that the resulting pulse sequence will have a phase error smaller in magnitude than the phase error for a previously implemented pulse sequence with the same gradient parameter.

* * * * *